United States Patent
Chaji et al.

(10) Patent No.: US 11,552,163 B2
(45) Date of Patent: Jan. 10, 2023

(54) STAGGERED AND TILE STACKED MICRODEVICE INTEGRATION AND DRIVING

(71) Applicant: VueReal Inc., Waterloo (CA)

(72) Inventors: Gholamreza Chaji, Waterloo (CA); Won Kyu Ha, Waterloo (CA); Aaron Daniel Trent Wiersma, Kitchener (CA); Ehsanollah Fathi, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 16/546,929

(22) Filed: Aug. 21, 2019

(65) Prior Publication Data

US 2020/0273945 A1    Aug. 27, 2020

Related U.S. Application Data

(60) Provisional application No. 62/809,163, filed on Feb. 22, 2019, provisional application No. 62/823,350, filed on Mar. 25, 2019.

(51) Int. Cl.
| | |
|---|---|
| *H01L 27/32* | (2006.01) |
| *H01L 27/15* | (2006.01) |
| *H01L 33/00* | (2010.01) |
| *H01L 33/36* | (2010.01) |
| *H01L 33/62* | (2010.01) |

(52) U.S. Cl.
CPC ........ *H01L 27/3293* (2013.01); *H01L 27/156* (2013.01); *H01L 27/3211* (2013.01); *H01L 27/3218* (2013.01); *H01L 33/0095* (2013.01); *H01L 33/36* (2013.01); *H01L 33/62* (2013.01)

(58) Field of Classification Search
CPC .............. H01L 27/3293; H01L 27/156; H01L 27/3218; H01L 27/3211
See application file for complete search history.

(56) References Cited

U.S. PATENT DOCUMENTS

| | | | |
|---|---|---|---|
| 2002/0070909 A1* | 6/2002 | Asano ................... | H01L 27/326 345/76 |
| 2012/0129301 A1 | 5/2012 | Bach | |
| 2015/0054008 A1 | 2/2015 | Rhee | |
| 2015/0327388 A1 | 11/2015 | Menard | |

(Continued)

OTHER PUBLICATIONS

International Search Report and Written Opinion in International Application No. PCT/IB2020/051504, dated May 27, 2020 (11 pages).

*Primary Examiner* — Feifei Yeung Lopez
(74) *Attorney, Agent, or Firm* — Nixon Peabody LLP

(57) ABSTRACT

What is disclosed is structures and methods to integrate microdevices into system or receiver substrates. The integration of microdevices is facilitated by adding staging pads to microdevices before or after transferring. Creating stages after the transfer of a first microdevice to a substrate for the subsequent microdevice transfer to the first (or the second) microdevice transfer. The stage improves the surface profile of the substrate so that next microdevice can be transferred without the first microdevice on the substrate get damaged by or interfere with the surface of the donor or transfer head. Some embodiments further relate to tiled display device and more particularly, to stacking tiles to a backplane to form the tiled display device.

7 Claims, 50 Drawing Sheets

(56) References Cited

U.S. PATENT DOCUMENTS

| | | |
|---|---|---|
| 2016/0218143 A1 | 7/2016 | Chaji |
| 2017/0122502 A1 | 5/2017 | Cok |
| 2017/0162553 A1 | 6/2017 | Bibi |
| 2017/0179097 A1 | 6/2017 | Zhang |
| 2017/0200412 A1* | 7/2017 | Gu .................. G09G 5/005 |
| 2017/0278733 A1 | 9/2017 | Chang |
| 2019/0229234 A1 | 7/2019 | Zou |

* cited by examiner

| SW_A1 | ON | OFF | ON |
|---|---|---|---|
| SW_A2 | OFF | ON | OFF |
| SW_B2 | ON | OFF | ON |
| SW_A3 | OFF | ON | OFF |
| SW_B3 | ON | OFF | ON |

| | | | | |
|---|---|---|---|---|
| SW_A1 | ON | OFF | ON | OFF |
| SW_A2 | OFF | ON | OFF | ON |
| SW_B2 | ON | OFF | ON | OFF |
| SW_A3 | ON | OFF | ON | OFF |
| SW_B3 | OFF | ON | OFF | ON |

| | | | | | | | | |
|---|---|---|---|---|---|---|---|---|
| SW_BC | ON | OFF | OFF | OFF | OFF | OFF | OFF |
| SW_C1 | ON | ON | OFF | OFF | ON | OFF | OFF |
| SW_C2 | ON | OFF | ON | OFF | OFF | ON | OFF |
| SW_C3 | ON | OFF | OFF | ON | OFF | OFF | ON |
| SW_E1 | ON | OFF | OFF | OFF | OFF | OFF | OFF |
| SW_E2 | ON | OFF | OFF | OFF | OFF | OFF | OFF |
| SW_E3 | ON | OFF | OFF | OFF | OFF | OFF | OFF |
| SW_D1 | OFF | ON | OFF | OFF | ON | OFF | OFF |
| SW_D2 | OFF | OFF | ON | OFF | OFF | ON | OFF |
| SW_D3 | OFF | OFF | OFF | ON | OFF | OFF | ON |

FIG. 15B

| | | | | | | | | |
|---|---|---|---|---|---|---|---|---|
| SW_BC | ON | OFF | OFF | OFF | | OFF | OFF | OFF |
| SW_E1 | ON | OFF | OFF | OFF | | OFF | OFF | OFF |
| SW_E2 | ON | OFF | OFF | OFF | | OFF | OFF | OFF |
| SW_E3 | ON | OFF | OFF | OFF | — | OFF | OFF | OFF |
| SW_D1 | OFF | ON | OFF | OFF | | ON | OFF | OFF |
| SW_D2 | OFF | OFF | ON | OFF | | OFF | ON | OFF |
| SW_D3 | OFF | OFF | OFF | ON | | OFF | OFF | ON |

STAGGERED AND TILE STACKED MICRODEVICE INTEGRATION AND DRIVING

CROSS-REFERENCE TO RELATED APPLICATION(S)

This application claims priority from U.S. Provisional Patent Application Nos. 62/809,163 filed on Feb. 22, 2019 and 62/823,350 filed on Mar. 25, 2019, which are incorporated herein by reference in their entirety.

FIELD OF THE INVENTION

The present disclosure relates to the integration of microdevices into system or receiver substrate and more particularly to creating stages to improve the surface profile of the receiver substrate. Some embodiments further relate to tiled display device and more particularly, to stacking tiles to a backplane to form the tiled display device.

SUMMARY

According to one embodiment, a method of integrating microdevices may be provided. The method may comprising: providing one or more microdevices on a donor substrate, integrating a first set of microdevices from the donor substrate to a system substrate, providing one or more staging pads to a second set of devices on the donor substrate; and integrating the second set of microdevices to the system substrate.

According to another embodiment, a method of stacking tile structure layers to a substrate may be provided. Each tile structure layer comprising plurality of microdevices. The method may comprising: releasing a first tile structure layer on the substrate, providing and aligning a second tile structure layer with the first tile structure layer on the substrate; and bonding the first tile structure layer and the second tile structure layer on the substrate, wherein the first tile structure and the second tile structure are physically separated from each other.

According to one embodiment, a display device may be provided. The display device may comprising a plurality of tile structures stacked with each other, each of the tile structure including: a substrate; an array of microdevices disposed on the substrate; top electrodes disposed on a first surface of each microdevice; and bottom electrodes disposed on a surface opposite to the first surface of the microdevices; and a backplane bonded to the plurality of the tile structures.

According to another embodiment, a solid state array device may be provided. The solid state array may comprising one or more pixels, each pixel has two or more microdevices and at least one of the two microdevices coupled to a pixel circuit and each microdevice is coupled to a bias voltage through a corresponding switch.

BRIEF DESCRIPTION OF THE DRAWINGS

The foregoing and other advantages of the disclosure will become apparent upon reading the following detailed description and upon reference to the drawings.

FIG. 2B-2 shows a donor substrate with integrated microdevices and stage pad for enabling integration of second microdevice, in accordance with an embodiment of the invention.

FIG. 15B shows the switching configuration during different operation periods, in accordance with an embodiment of the invention.

FIG. 16B shows the switching configuration during different operation periods, in accordance with an embodiment of the invention.

Use of the same reference numbers in different figures indicate similar or identical elements.

Figure 1A:
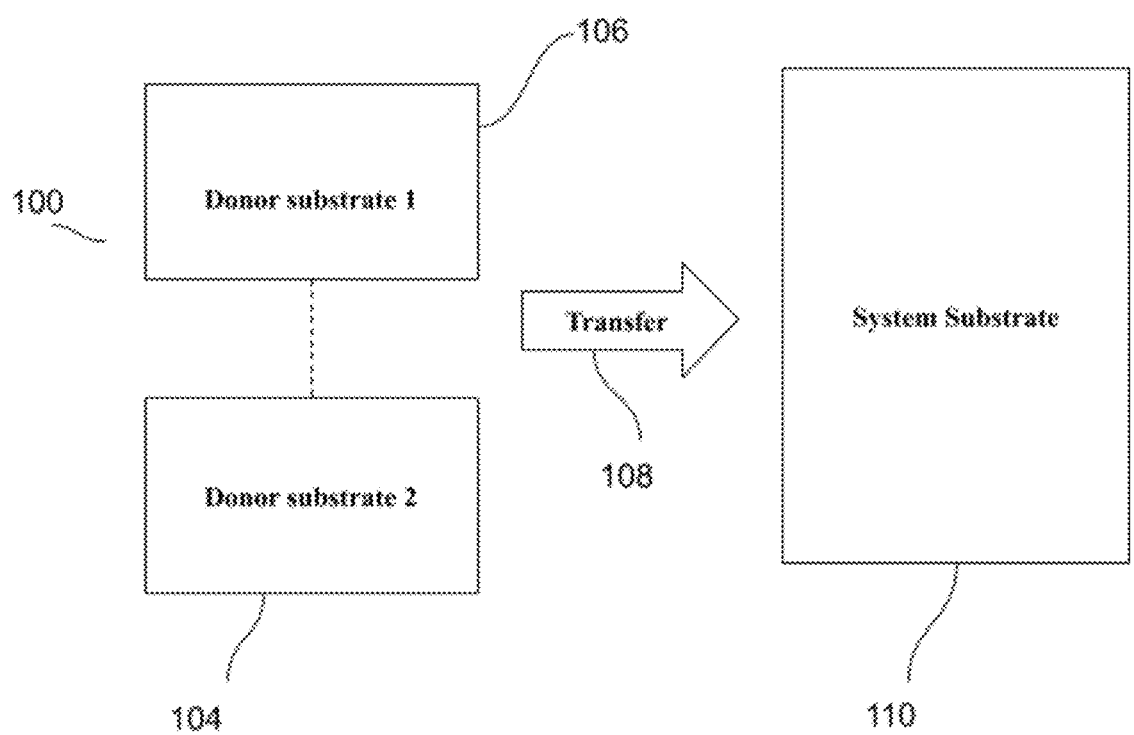
FIG. 1A shows a process of integrating multi microdevices into a system substrate, in accordance with an embodiment of the invention.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION

In this description, the term "device" and "microdevice" are used interchangeably. However, it is clear to one skilled in the art that the embodiments described here are independent of the device size.

In this description, the term "system substrate", "receiver substrate" and "backplane" are used interchangeably. However, it is clear to one skilled in the art that the embodiments described here are independent of the substrate type.

According to one embodiment, one or more stages may be created after the transfer of a first microdevice to a system (temporary) substrate for the subsequent microdevice transfer to the first (or the second) microdevice transfer. The stage improves the surface profile of the system (temporary) substrate so that next microdevice can be transferred without the first microdevice on the substrate get damaged by or interfere with the surface of the donor or transfer head.

According to another embodiment, the stage can be a planarization layer that is formed on the substrate after the transfer of the first microdevice. In one case, the stage is a pillar that is formed on the substrate. In another case, the stage is a pillar that is formed on the microdevice surface.

According to one embodiment, the stage can be a combination of the abovementioned methods.

According to another embodiment, the stage can be conductive and can connect the microdevice to a signal. In one case, vias can be opened through the stage to couple the microdevice to a signal. In another case, pads can be formed in the vias for connections.

According to one embodiment, the first microdevice can be a part of the stage.

According to another embodiment, a conductive layer can connect the common electrode to first and second (or other stacked) microdevices. In one case, the conductive layer is part of the stage.

According to one embodiment, the second microdevice may have a slight overlap with the first device, but not completely cover the device. After the second electrode is deposited and etched, a bonding layer may be added to the electrode and then the second device is integrated. This process may be repeated for all further device integrations.

In one embodiment, a reflective layer may be added to the individual devices in these embodiments or a complete set of devices for each pixel. The conductive electrode may be used as a reflective layer as well.

In another embodiment, the top electrode may have two parts: a reflective part at a vertical side and a transparent electrode at the top side.

In one embodiment, one electrode is connected to two different microdevice contacts. Here, switches are used to couple the electrode to different signals depending on the function of different microdevices.

In one case, the staging pads profile in all structures mentioned herein may be either higher or lower than the system substrate surface. In another case, the staging pads profile may be made of a few different layers. In one embodiment, the staging pads may be higher than the system substrate surface to offer more selectivity.

In one embodiment, the staging pads may be conductive and create electrical connection between the system substrate and microdevices.

In another embodiment, one or more planarization layers may be formed to level the system substrate surface. In one case, an opening through the planarization layer(s) may be provided to create contact between the microdevices and system substrate. In another case, the staging pads and the planarization layer may be the same. In another case, the staging pads may be formed separately.

In one case, the microdevices may have more than one connection at each side.

In one embodiment, a backplane may be formed on top, bottom or in between the planarization layer.

In another embodiment, a buffer layer or a release layer may be formed before the microdevices on the system substrate. The buffer layer and the release layer may be the same or different layers.

In another case, a bonding layer may be added to the electrode and the microdevices.

In one embodiment, a reflective layer may be added to individual devices. In one case, the conductive electrode may be used as a reflective layer as well. In this case, the top electrode may have two parts: a reflective part at a vertical side and a transparent electrode at the top side.

In another embodiment, where the devices are sharing an electrode, the devices may be driven in a combination method.

In one embodiment, pixel structures with shared electrodes between different microdevices may be provided.

In another embodiment, programmable switches may be provided to change the pixel configuration.

In one embodiment, one may perform time multiplexing. Here, the driver is shared between the devices and may be allocated to each device for a given time during the frame time.

Various embodiments in accordance with the present structures and processes provided are described below in detail.

Many microdevices, including light emitting diodes (LEDs), organic LEDs, sensors, solid state devices, integrated circuits, microelectromechanical systems (MEMS) and other electronic components, are typically fabricated in batches, often on planar substrates. To form an operational system, microdevices from at least one donor substrate need to be transferred to a receiver substrate.

With reference to FIG. 1A, a block diagram of an example of transferring and integrating a plurality of microdevices into a system substrate is provided. In one embodiment, one or more microdevices may be fabricated on a donor substrate. The one or more microdevices may be transferred and integrated to a system substrate or a temporary substrate. The microdevices may be transferred from different donor substrates. The block diagram 100 may include one or more donor substrates (104, 106) with one or more microdevices fabricated on them. There may be a plurality of donor substrates. A transfer mechanism 108 may be applied to transfer one or more microdevices from the one or more donor substrates to landing areas on a system substrate 110.

Figure 1B:
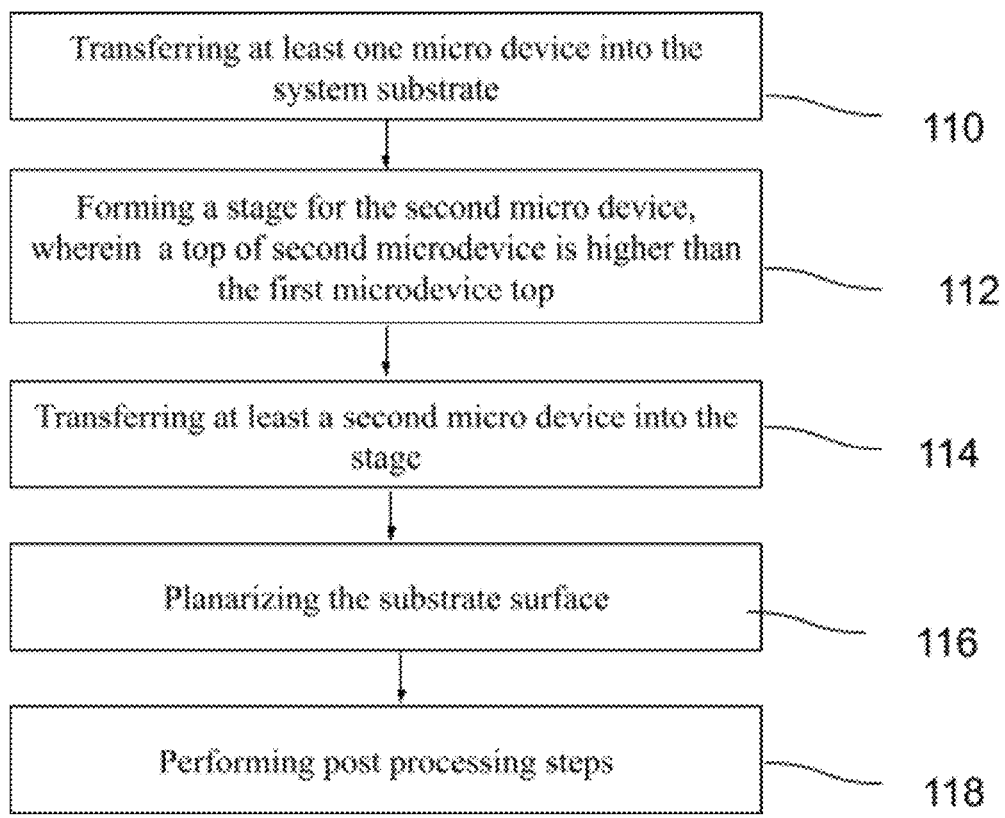
FIG. 1B shows an example of processing steps for integrating multi devices into a substrate (temporary or system substrate), in accordance with an embodiment of the invention.

FIG. 1B illustrates an example method of processing steps for integrating multi devices into the system substrate. In the first step 110, at least one microdevice can be transferred into the system substrate. At step 120, after the first microdevice is transferred, a stage is formed at the system substrate for at least one second microdevice, wherein a top of second microdevice is higher than a top of the first microdevice. The stage can also have adhesive property to assist in the transfer of the microdevice. In another case, extra bonding layer may form on top of the stage. Further at step 114, the at least one second microdevice is transferred onto the stage and the substrate surface is planarized at step 116. In some cases, the planarization layer can be eliminated, and at step 118, the post processing steps can be performed. The post processing can include, electrode deposition, forming vias/opening for accessing the microdevices, optical layers deposition and etc.

Figure 1C:
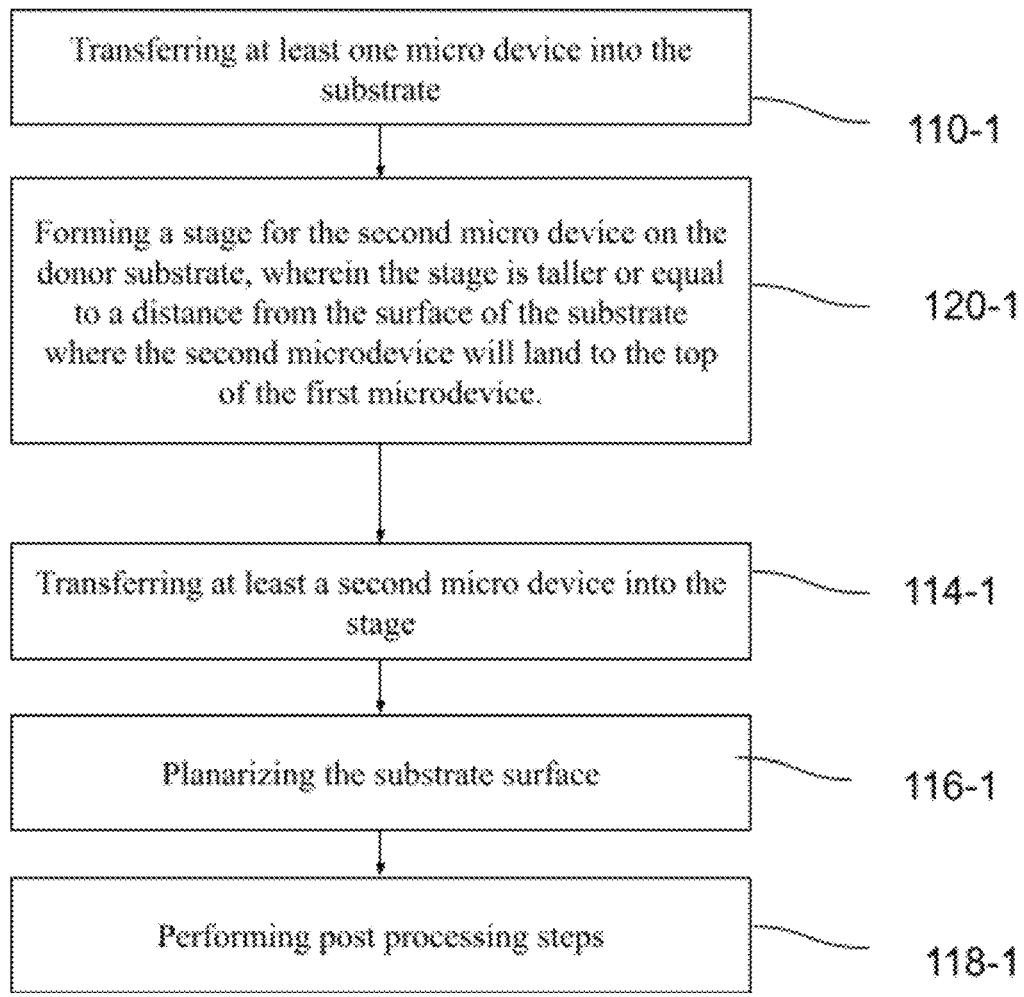
FIG. 1C shows another example of processing steps for integrating multi devices into a substrate (temporary or system substrate), in accordance with an embodiment of the invention.

FIG. 1C illustrates an example method of processing steps for integrating multi devices into the system substrate. In the first step 110-1, at least one microdevice can be transferred into the system substrate. At step 120-1, after the first microdevice is transferred, a stage is formed at the system substrate for at least one second microdevice, wherein the stage is taller than or equal to a distance from the surface of the substrate where the second microdevice will land to the top of the first microdevice. The stage can also have adhesive property to assist in the transfer of the microdevice. In another case, extra bonding layer may form on top of the stage. Further at step 114-1, the at least one second microdevice is transferred onto the stage and the substrate surface is planarized at step 116-1. In some cases, the planarization layer can be eliminated, and at step 118-1, the post processing steps can be performed. The post processing can include, electrode deposition, forming vias/opening for accessing the microdevices, optical layers deposition and etc.

Figure 2A:
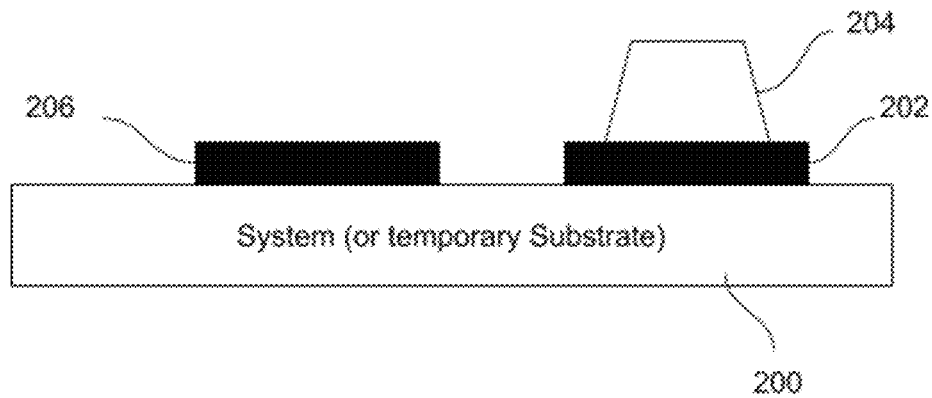
FIG. 2A shows a system substrate with integrated a first microdevice, in accordance with an embodiment of the invention.

FIG. 2A shows a system substrate with a first integrated microdevice, in accordance with an embodiment of the invention. Here, a system or temporary substrate 200 can be provided with landing area (or landing surface) (202, 206) formed on a surface of the system substrate 200. There can be pads as part of the landing area (202, 206) for microdevices. The pads can be only for assisting in the transfer (e.g. bonding layer or adhesion layers) or can be coupling the microdevice to a signal. A first microdevice 204 is transferred from a donor substrate and integrated to a corresponding landing area 202 on the system substrate 200.

In one embodiment, a stage can be formed on the system substrate surface where the second micro device will be transferred (landing area) for enabling integration of the second microdevices and improving the surface profile of receiver substrate. The stage can be on top of a pad or directly on another surface. The height of the stage is equal or higher than the combined height of the first microdevice plus the first landing area minus the height of the landing area of the second microdevice.

In one case, the staging pads may be deposited and etched on the substrate. In another case, the staging pad is transferred, printed, or deposited on the substrate.

Figures 1, 2B:
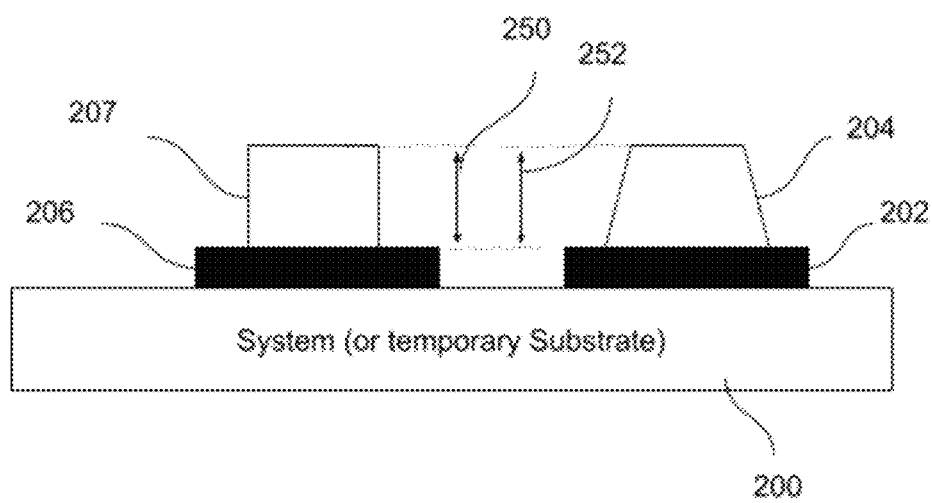
FIG. 2B-1 shows a system substrate with integrated microdevices and stage pad for enabling integration of second microdevice, in accordance with an embodiment of the invention.

FIG. 2B-1 shows a system substrate with integrated first microdevice and stage for enabling integration of a second microdevice, in accordance with an embodiment of the invention. Here, a stage 207 may be provided to facilitate the integration of the second microdevice. The stage 207 may be formed on a top surface of the corresponding landing area 206 where the second microdevice will be transferred next. The stage 207 is used to ready the system substrate surface for the second microdevice integration. Here, after a first microdevice 204 is integrated into the system substrate, the location of the second (or more) microdevice integration may be raised by adding stages/staging pads that facilitate the integration of second and other microdevices. This process may continue for several other microdevice series integration. The stage 207 can be on top of a pad or directly on another surface. The height of the stage 250 is equal or higher than the combined height 252 of the first microdevice 204 plus the first landing area 202 minus the height of the landing area 206 of the second microdevice 208.

In one embodiment, a stage can be formed on the temporary substrate before transferring the second microdevice the system substrate.

Figures 2, 2B:
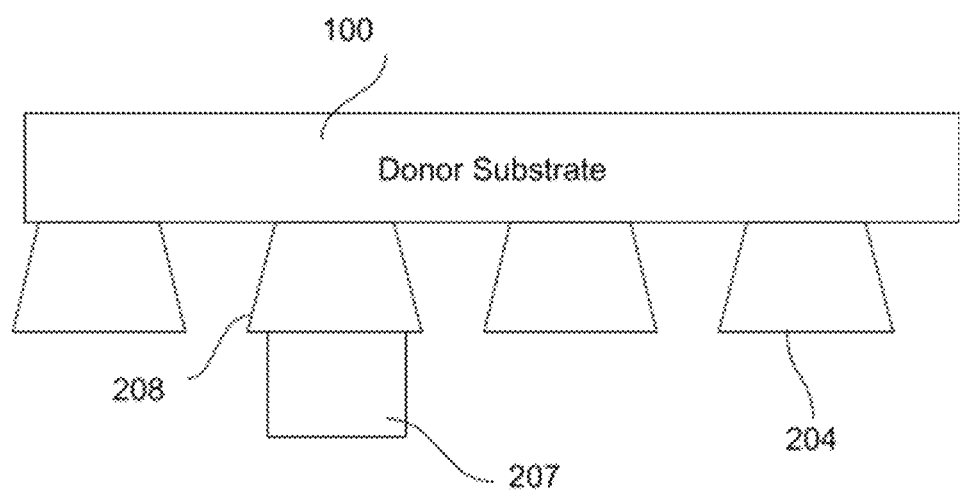

FIG. 2B-2 shows a donor substrate with integrated microdevices and stage pad for enabling integration of second microdevice, in accordance with an embodiment of the invention. Here, the donor substrate 100 may be provided with the stage 207 formed on the microdevice(s) 208 before getting transferred to the system substrate. In one case, one or more staging pads may be used for each microdevice. In another case, the staging pads may only be added to the device areas that are being integrated next.

In one embodiment, a microdevice donor substrate with at least one stage microdevice may be ready for being integrated into system substrate which include at least one another microdevice.

Figure 2C:
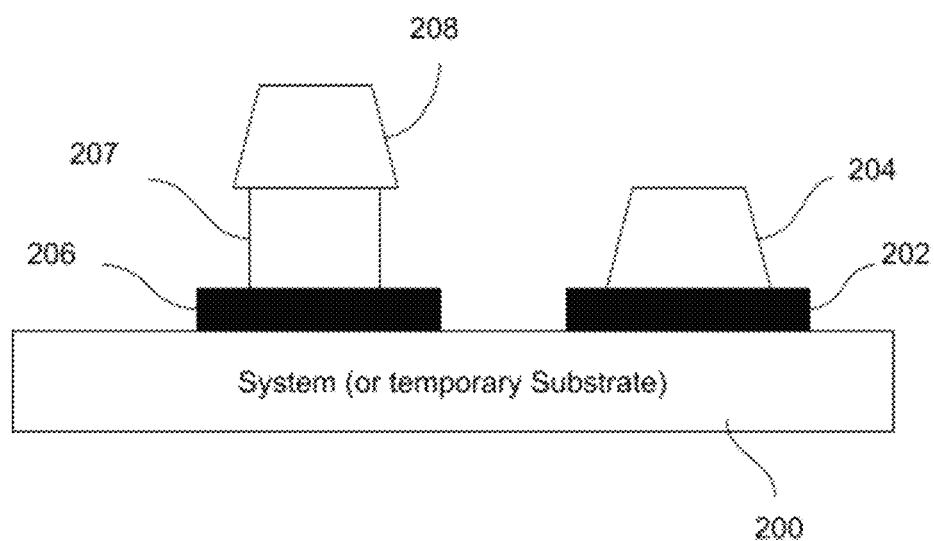
FIG. 2C shows integration of at least one another microdevice with stage on the receiver substrate, in accordance with an embodiment of the invention.

FIG. 2C shows integration of at least one another microdevice with stage on the receiver substrate, in accordance with an embodiment of the invention. Here, the second microdevice 208 with stage 207 on the donor substrate may be transferred to the corresponding landing area 206 on the system substrate 200 which include at least one another microdevice. The stage 207 may be conductive and create an electrical connection between the system substrate 200 and the second microdevice 207. The stage may be transferred to the system substrate by any means described in this disclosure or other methods, or it may be deposited or etched.

In case more than two devices are integrated into the system substrate, the second staging pad may be transferred into the second and third device areas. Then, after the integration of the second device, another staging pad is transferred into the position where a third device may be integrated. This process may also be followed for more than three devices.

In one embodiment, the staging pads may be higher than the system substrate surface to offer more selectivity when transferring. After all devices are transferred, the surface may be leveled using a planarization layer. If a common electrode is needed, an opening need to be created in the planarization layer to deposit the common electrode.

In one case, the staging pads and the planarization layer may be the same. In another case, the staging pads may be formed separately.

Figure 3A:
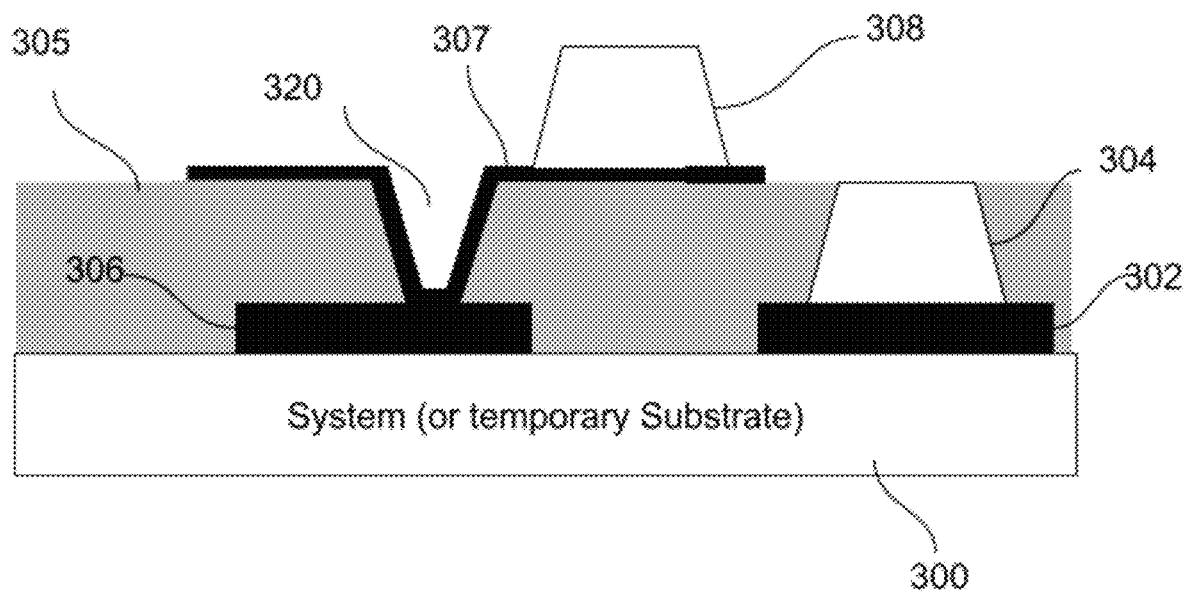
FIG. 3A-3C shows a system (or temporary) substrate where the microdevice different from the first microdevice is transferred on a different level from the first microdevice, in accordance with an embodiment of the invention.
Figure 3B:
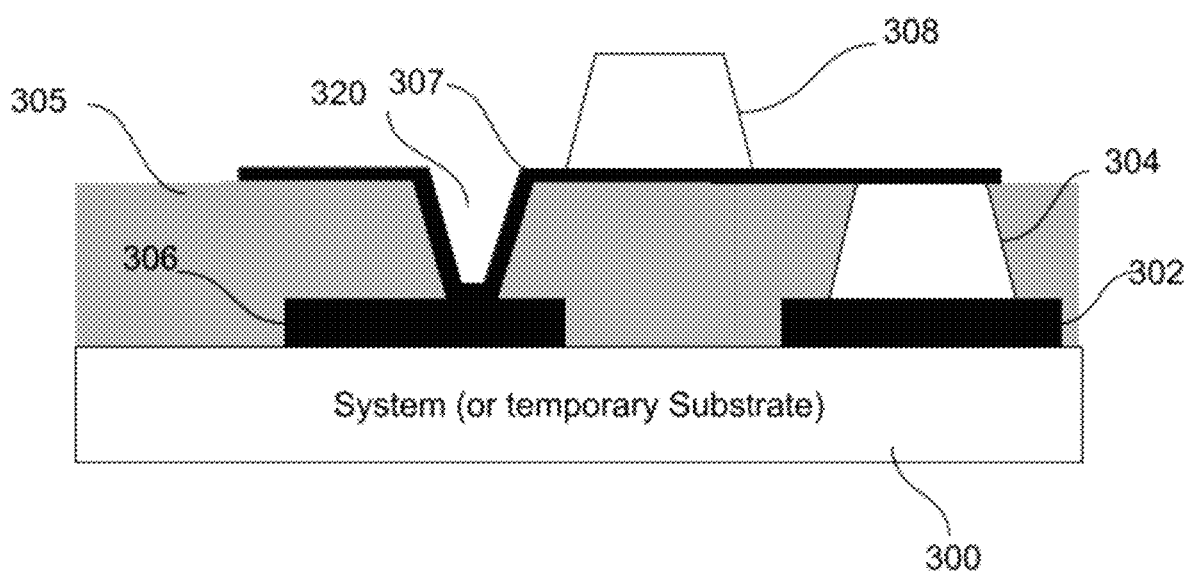
Figure 3C:
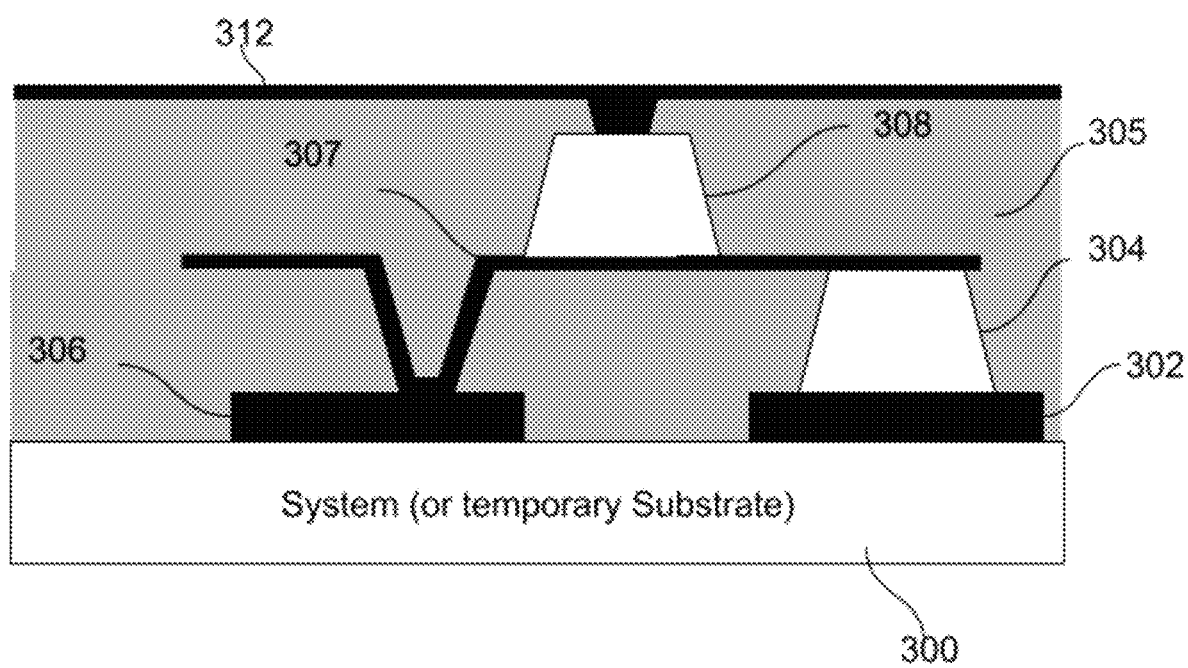

FIG. 3A-3C shows a system (or temporary) substrate where the microdevice different from the first microdevice is transferred on a different level from the first microdevice, in accordance with an embodiment of the invention. With reference to FIGS. 3A-3C, a staggered structure may be provided to integrate the microdevices to the system substrate. FIG. 3A shows a system (or temporary) substrate where a second microdevice different from the first microdevice is transferred on a level different from the first microdevice. The system substrate includes the integration of a first microdevice 304 and a second microdevice 308 as discussed above (in FIGS. 2B-1 and 2C). A first microdevice 304 is transferred to a corresponding landing area 302 on the system substrate. A second microdevice 308 may be transferred on a different level from the first microdevice 304. After the integration of the first microdevice 304, the surface of the system substrate is leveled with a planarization layer 305. Then, an opening 320 may be made through the planarization layer 305 to create a connection between the second microdevice 308 and the system substrate 300. An electrode 307 may be provided to the second microdevice 308 to make a connection with the system substrate 200.

FIG. 3B shows that a system (or temporary) substrate 300, wherein the second microdevice different from the first microdevice 304 is transferred on a different level from the first microdevice 304. After the integration of the first microdevice 304, the surface of the system substrate is leveled with a planarization layer 305. Then, an opening 320 may be made through the planarization layer 305 to create a connection between the second microdevice 308 and the system substrate 300. An electrode 307 may be provided to the second microdevice 308 to make a connection with the system substrate 200 which can be a common electrode for the first microdevice too.

FIG. 3C shows a system (or temporary) substrate where there are two microdevices (304, 308) sharing a common electrode 307. The planarization layer 305 may be extended to a surface of the second microdevice 308. There can be another electrode 312 for the second microdevice 308 through a second opening in the planarization layer 305.

Figure 4:
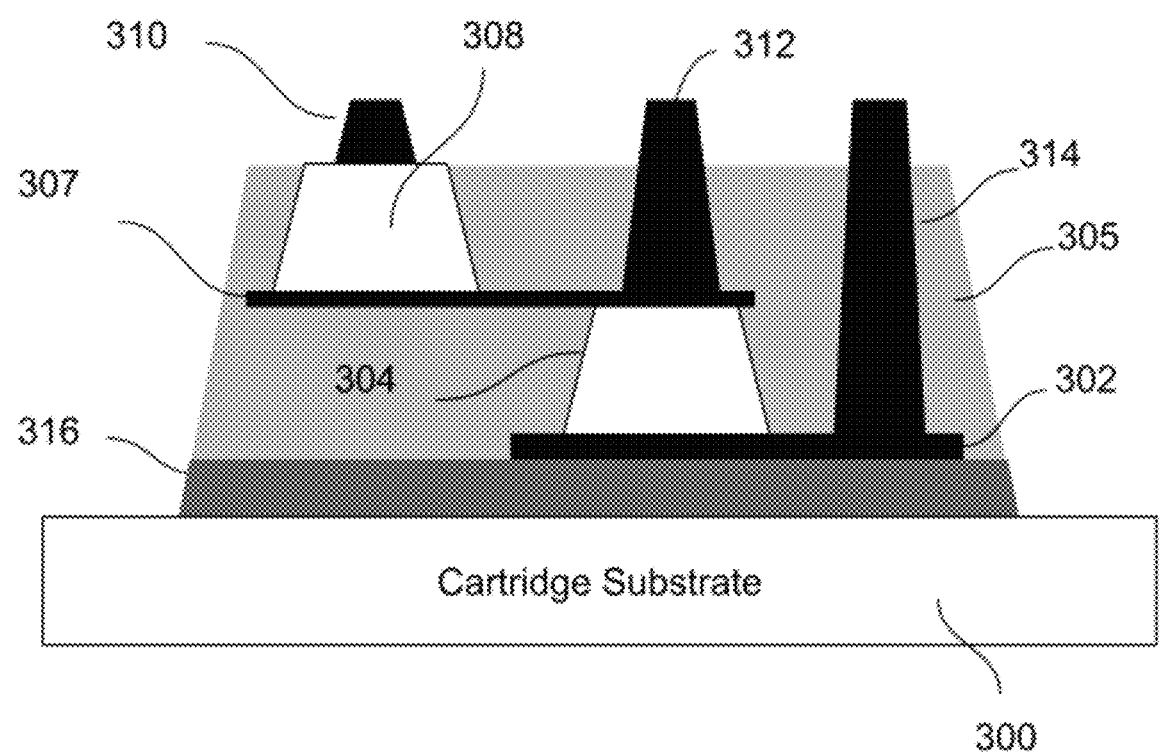
FIG. 4 shows stacked microdevices with pads while at least one electrode and pad is shared, in accordance with an embodiment of the invention.

FIG. 4 shows stacked microdevices with staging pads while at least one electrode and pad is shared, in accordance with an embodiment of the invention. Here, a temporary substrate/cartridge substrate 300 may be provided. A buffer layer/release layer 316 may be deposited on the cartridge substrate 300 to facilitate release of microdevices. The buffer layer 316 may be formed before the microdevices. The release layer may be a separate layer formed on top of the substrate. The release layer may be the same as the buffer layer. Here, two microdevices 304 and 308 may be provided. The two microdevices may share at least one common electrode 307 and a common staging pad 312. A separate stage 314 may be provided for the first microdevice 304 on a landing area 302 and a separate stage 310 may be provided for the second microdevice 308.

Figure 5:
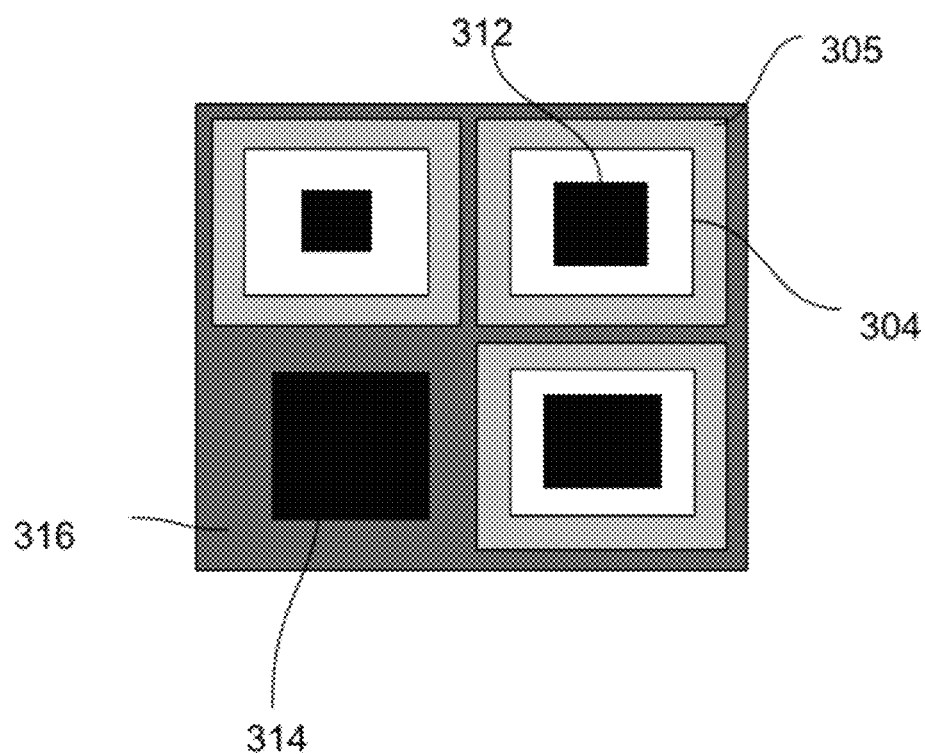
FIG. 5 shows a top view of a stacked microdevice, in accordance with an embodiment of the invention.

FIG. 5 shows a top view of stacked microdevices as shown in FIG. 4, in accordance with an embodiment of the invention. Here, a microdevice 304 is having a staging pad shared staging pad 312. A planarization layer 305 may be deposited covering the microdevice and the staging pad. A buffer layer/release layer 316 may be deposited on the cartridge substrate to facilitate release of microdevices. A separate staging pad 314 may be provided for the first microdevice 304.

Figure 6:
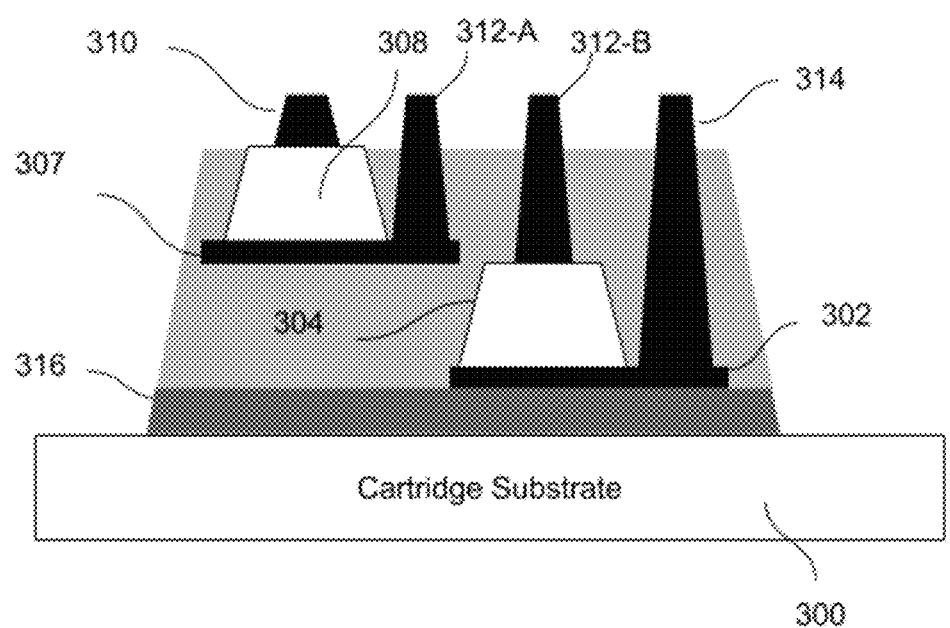
FIG. 6 shows stacked microdevices with pads with separate electrode and pad for each device, in accordance with an embodiment of the invention.

FIG. 6 shows stacked microdevices with pads with separate electrode and pad for each device. Here, a cartridge substrate 300 is provided. A buffer layer/release layer 316 may be deposited on the cartridge substrate 300 to facilitate the release of microdevices. Here, two microdevices 304 and 308 may be provided. The two microdevices may be stacked together with separate electrodes and staging pads. Here, the first microdevice 304 may be provided with an electrode 302 and stages (314 and 312-B). The second microdevice 308 may be provided with another electrode 307 and stages (310 and 312-A).

Figure 7:
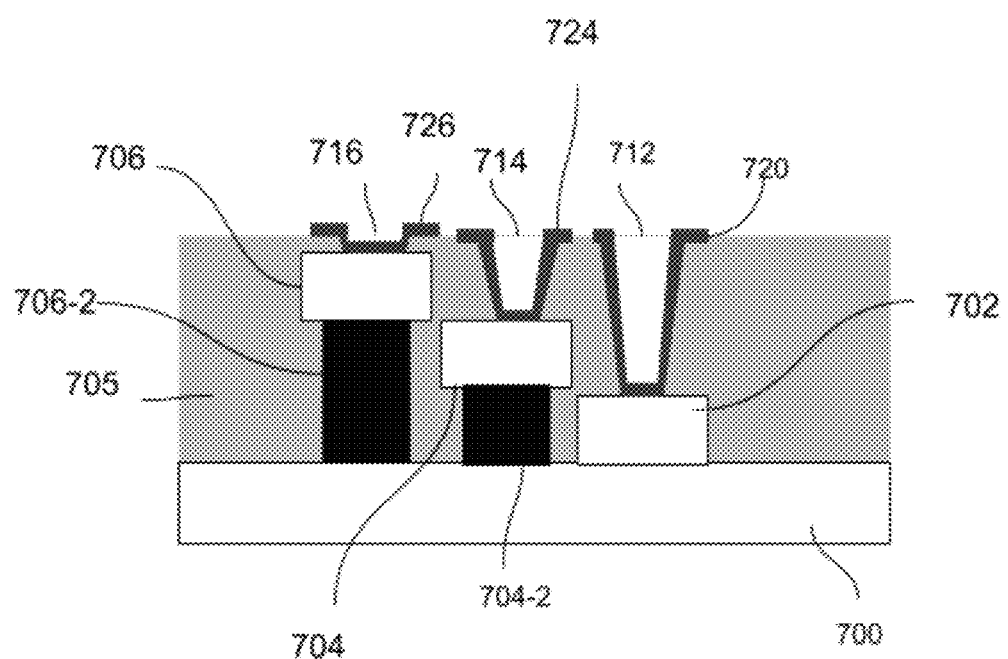
FIG. 7 shows stacked microdevices with pads on a system substrate, in accordance with an embodiment of the invention.

FIG. 7 shows stacked microdevices with pads on a system substrate, in accordance with an embodiment of the invention. Here, a stack of a plurality of microdevices with staging pads on a system substrate may be provided. Here, for example, three microdevices 702, 704 and 706 are provided. A first microdevice 702 may be integrated to the system substrate 700. In one case, there can be a staging pad for the first microdevice 702 for integration to the system substrate. In another case, the first microdevice 702 may be integrated directly to the system substrate. For the integration of a second microdevice. E.g., 704, a staging pad 704-2 may be provided to facilitate the integration of the second microdevice 704 to the system substrate. The staging pad 704-2 is used to ready the system substrate surface for the second microdevice 704 integration.

In one embodiment, after the integration of the first microdevice 702 into the system substrate, the location of integration for the second (or subsequent) microdevices, may be raised by adding staging pads that facilitate the integration of second and other microdevices. This process may continue for several other microdevice series integration. For example, a third microdevice 706 may be integrated to the system substrate with a raised staging pad 706-2.

In one embodiment, the staging pads may be conductive for connecting the microdevices to a signal. In another embodiment, a planarization layer 705 may be formed on and over the microdevices and staging pads. Vias (712, 714, 716) may be made through the planarization layer 705 for providing electrode (720, 724, 726) to each microdevice for connecting the microdevices to the signal. In one case, the microdevices may have more than one connection at each side. In this case, more than one via may be needed for each microdevice. The stage can be the same as planarization layer (after each device a planarization layer can be deposited).

In another embodiment, a backplane may be formed on top of the planarization layer. In one case, the backplane may be at the bottom or in between the planarization layer.

In one embodiment, a buffer layer may be formed before the microdevices are formed or transferred. In one case, a release layer may be formed on top of the substrate. The release layer and the buffer layer may be the same or different layer.

FIG. 8A-8E shows different arrangements of placing the microdevices with stages, in accordance with an embodiment of the invention. Here, a system (or temporary) substrate where the microdevice different from the first microdevice is transferred on a different level from the first microdevice in different arrangements may be provided.

Figure 8A:
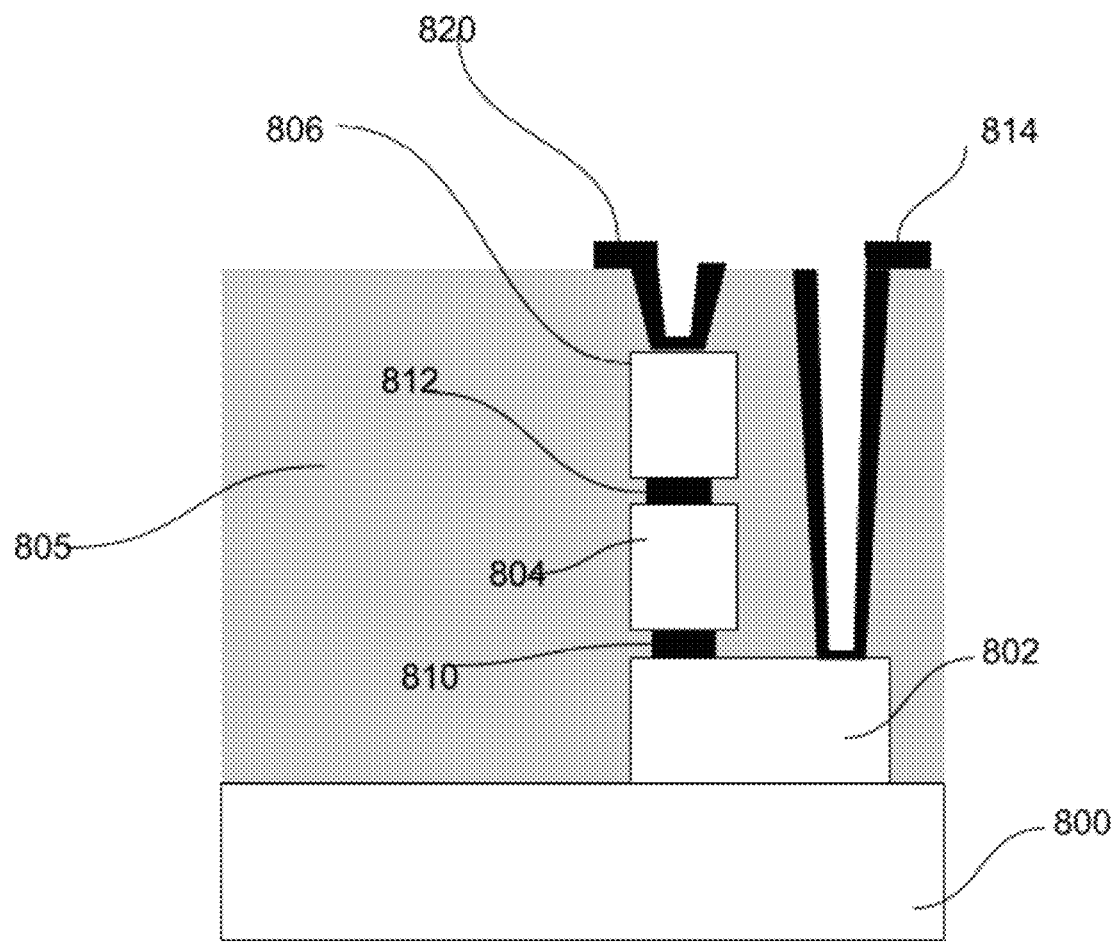
FIG. 8A-8E shows different arrangements of placing the microdevices with stages, in accordance with an embodiment of the invention.

With reference to FIG. 8A, here, microdevices overlapped and connected through a common electrode. In one case, microdevices (802, 804 and 806) can have overlap (stage can be used to support the other side of the device). The overlap can be used to connect the common electrode 820. In one case, the common electrode 820 can be connected to both bottom and top side of the device. Stacking microdevices on top of each other enables the connection between the microdevices. Each microdevice can have one or more other connection as well. A first microdevice 802 may be transferred into the substrate 800. A second microdevice 804 different from the first microdevice 802 may be transferred to the substrate at a different level from the first microdevice. A planarization layer 805 may be formed on the substrate after the transfer of the first microdevice. A stage can be planarization layer 805. The stage is conductive and can connect the microdevices to a signal. Further, a via/opening is opened through the stage to couple the microdevice to a signal. An electrode 814 for first microdevice may be provided through the opening. A common connection 810 may be provided between the first microdevice 802 and the second microdevice 804. This process may continue for the third and more device series integration. After integration of second microdevice, another stage is transferred. A third microdevice 806 may be transferred to substrate. The second and third microdevices may share a connection 812. A common electrode 820 may be provided for all the transferred microdevices.

Figure 8B:
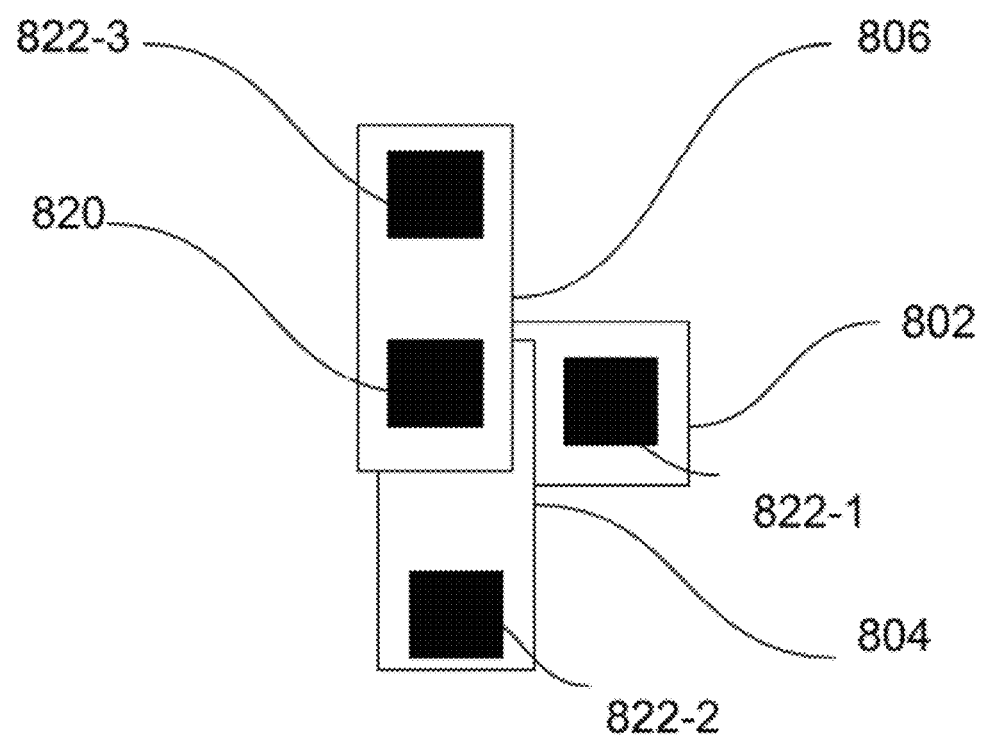

FIG. 8B shows a top view of FIG. 8A, in accordance with an embodiment of the invention. Here, microdevices overlapped and connected through a common electrode. In one case, the microdevices (802, 804 and 806) can have overlap (stage can be used to support the other side of the device). The overlap can be used to connect the common electrode 820. In one case, the common electrode 820 can be connected to both bottom and top side of the device. Stacking microdevices on top of each other enables the connection between the microdevices. Each microdevice can have one or more other connection as well e.g, the first microdevice 802 may be provided with an electrode/contact 822-1, the second microdevice may be provided with an electrode/contact 822-2 and the third microdevice 806 may be provided with an electrode/contact 822.

Figure 8C:
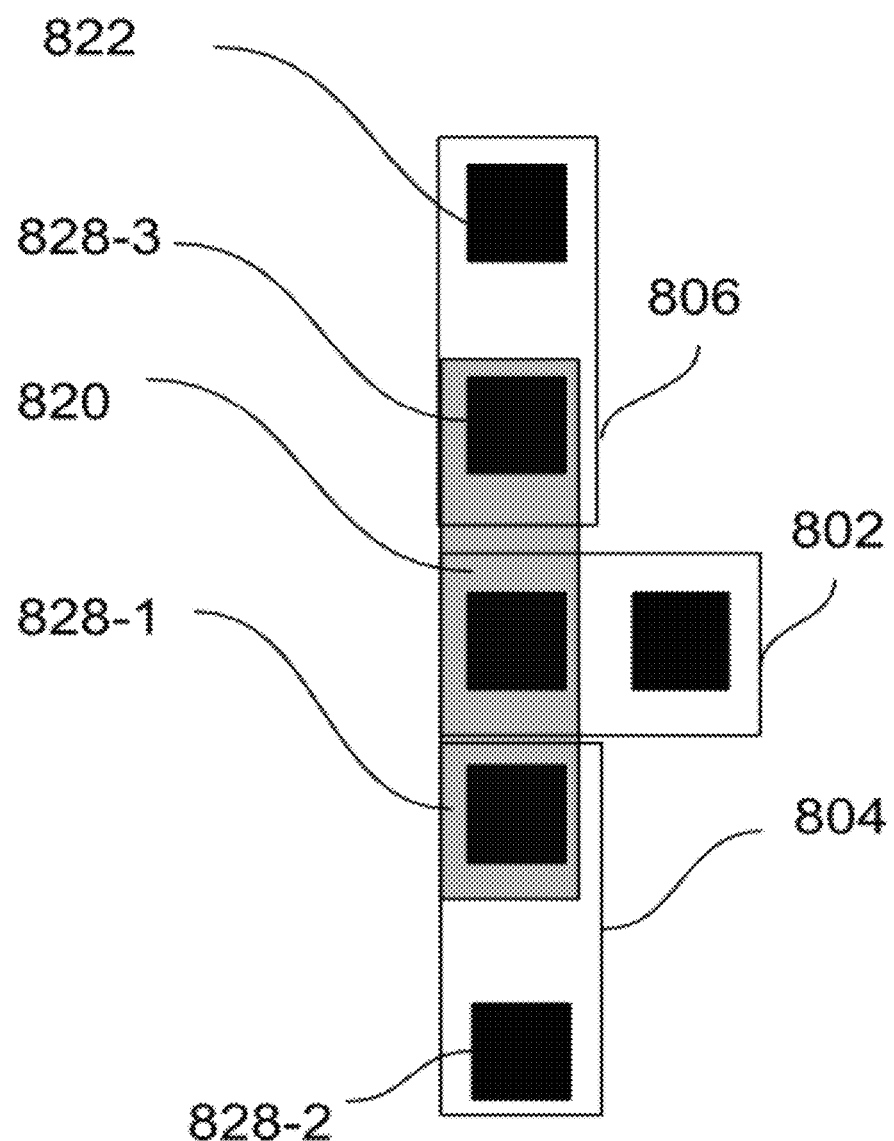

FIG. 8C shows different arrangements of placing the microdevices with stages, in accordance with an embodiment of the invention. Here, the microdevices 802, 804 and 806 may be provided. Each microdevice may be provided with a corresponding electrode and a contact to make a connection with the system substrate. For example, the microdevice 806 may be provided with an individual electrode 822 and a contact 828-3. Further, a common electrode 820 may be formed on the provide connections to microdevices.

Figure 8D:
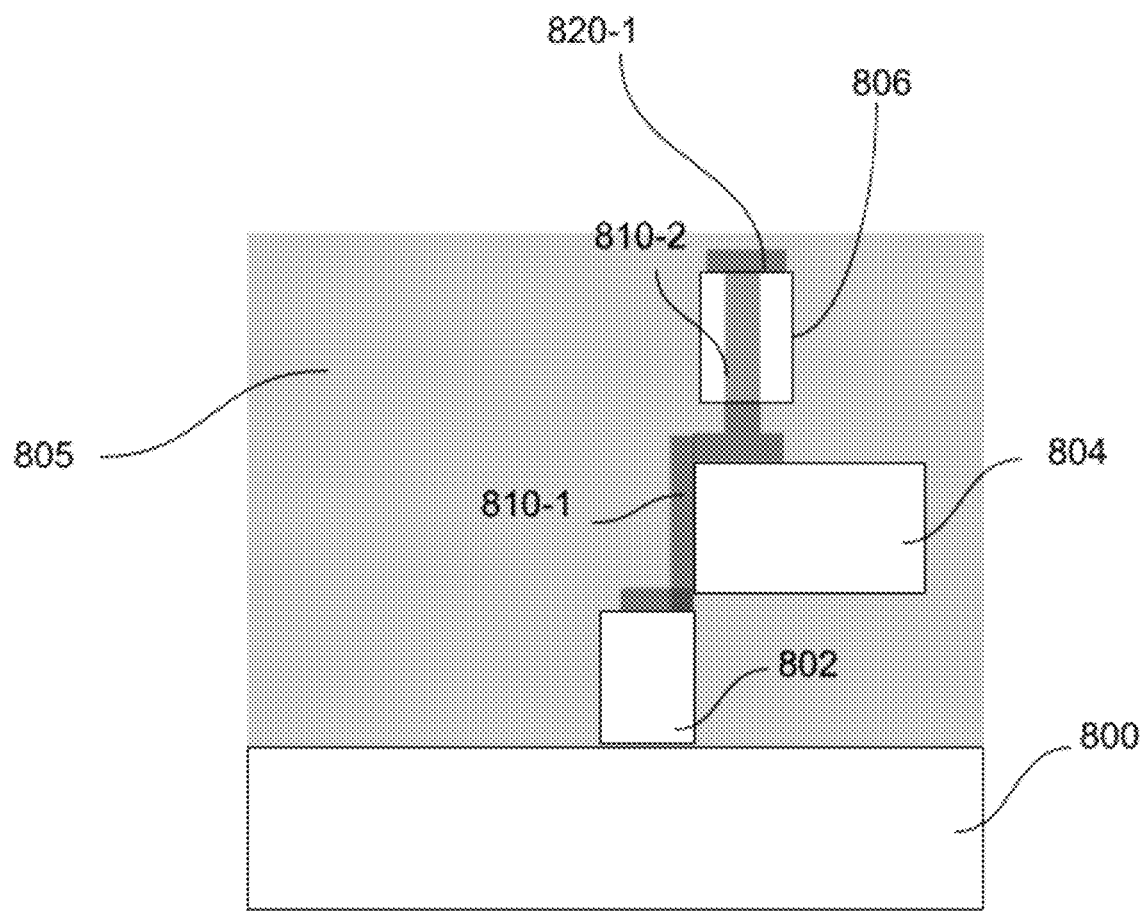

FIG. 8D shows different arrangements of placing the microdevices with stages, in accordance with an embodiment of the invention. Here, the three microdevices 802, 804 and 806 may be provided. The microdevices may be provided with common connections. There may be a common connection 810-1 between the first microdevice 802 and the second microdevice 804 and a common connection 810-2 between the second microdevice 804 and a third microdevice 806. In one case, each microdevice may be provided with a corresponding electrode to make a connection with the system substrate 800. In another case, there may be common electrode 820-1 between the microdevices. Further, a planarization layer 805 may be formed on the substrate after the transfer of the first microdevice. A stage can be planarization layer 805. The stage is conductive and can connect the microdevices to a signal.

Figure 8E:
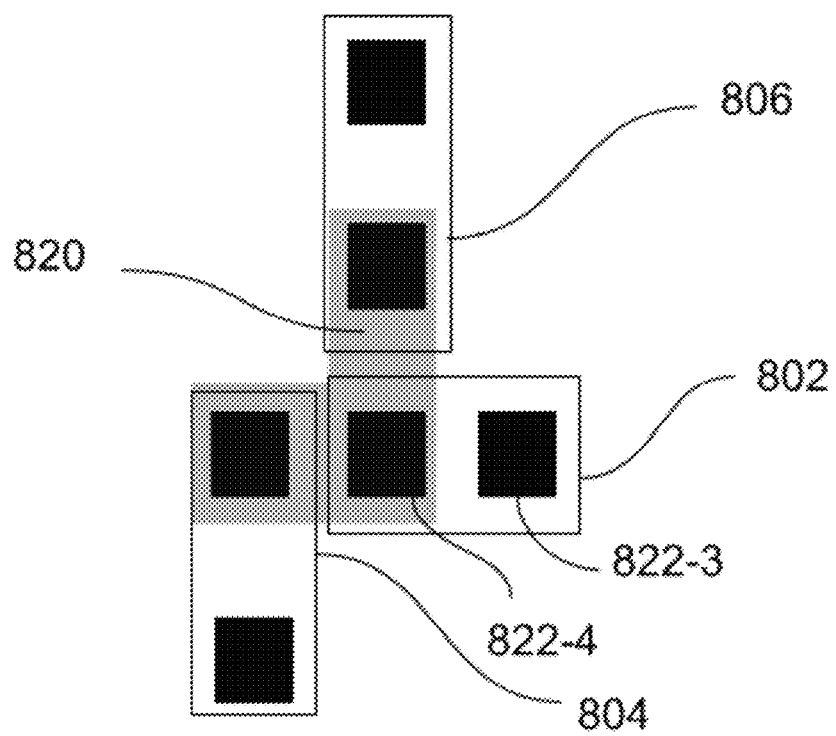

FIG. 8E shows a top view of FIG. 8D, in accordance with an embodiment of the invention. Here, microdevices are connected through a common electrode. In one case, the common electrode 820 can be connected to both bottom and top side of the device. Stacking microdevices on top of each other enables the connection between the microdevices. Each microdevice can have one or more other connection as well e.g, the first microdevice 802 may be provided with an electrode 822-3 and a contact 822-4.

According to one embodiment, a solid state array device may be provided. The solid state array device may comprising one or more pixel circuits, each pixel circuit has two or more microdevices and at least one of the two microdevices coupled to one pixel circuit and each microdevice is coupled to a bias voltage through a switch.

According to another embodiment, the one of the microdevices is decoupled from the shared pixel circuits from the switch and coupled to the bias voltage which turns off the microdevice.

Figure 9A:
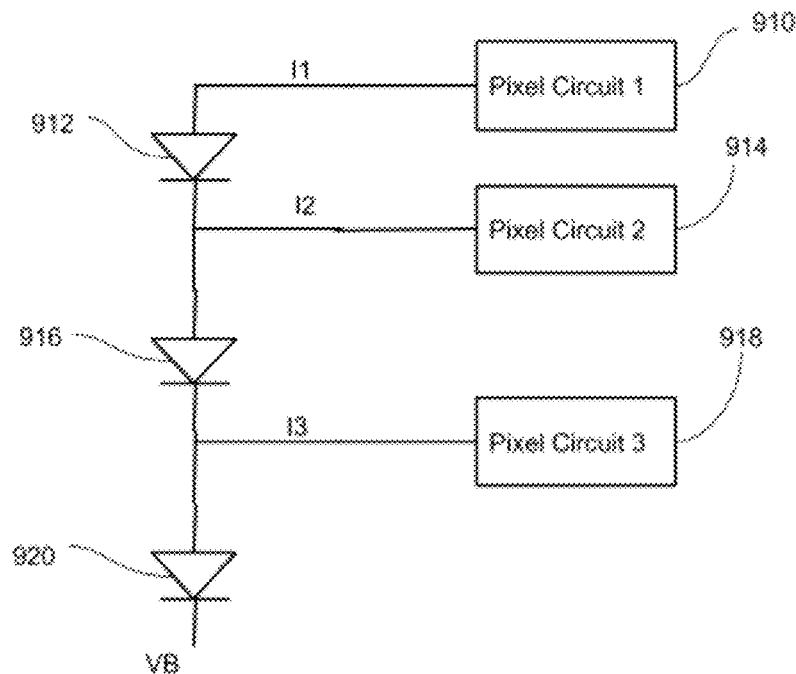
FIG. 9A-9B shows exemplary pixel structures with shared electrodes between different microdevices, in accordance with an embodiment of the invention.
Figure 9B:
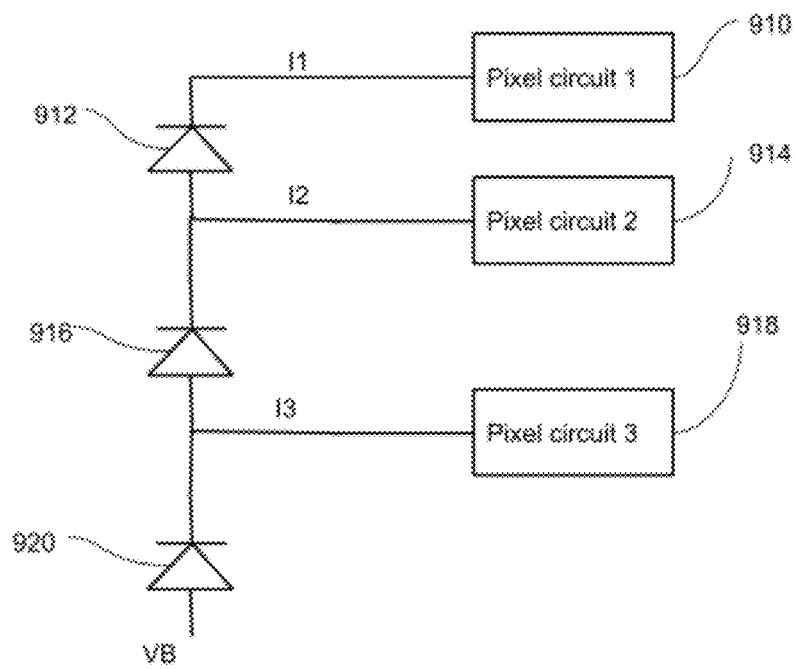

FIG. 9 shows a pixel structure with shared electrodes between different microdevices. FIG. 9A-9B show a driving scheme for microdevices, according to one embodiment of the present invention. Here, the embodiment shows a combination driving method of the devices with a shared electrode. Three microdevices 912, 916, and 920 may be provided with corresponding pixel circuits 910, 914, and 918. In a case where the devices are sharing an electrode, one may drive the devices in a combination method. FIGS. 9A-9B shows an embodiment of such a driving scheme. In FIG. 9A, a voltage source $V_B$ may be applied to each microdevice. I1 defines the driving force of first device 912, I1+I2 defines the driving force of second device 916 and, I1+I2+I3 defines the driving force of third device 920. This daisy chain may be extended to more devices as well. FIG. 9B shows an alternate arrangement for microdevices 912, 916, and 920, where I3 defines the driving force of third device 918, I2+I3 defines the driving force of second device 916 and, I1+I2+I3 defines the driving force of third device 912. This daisy chain may be extended to more devices as well. In one case, each of the voltage sources may be replaced with a current source.

FIGS. 10A-10E show a time multiplexing driving scheme, according to one embodiment of the present invention. In one case, time multiplexing may be provided between the devices. Here, the driver is shared between the devices and may be allocated to each device for a given time during a frame time.

Figure 10A:
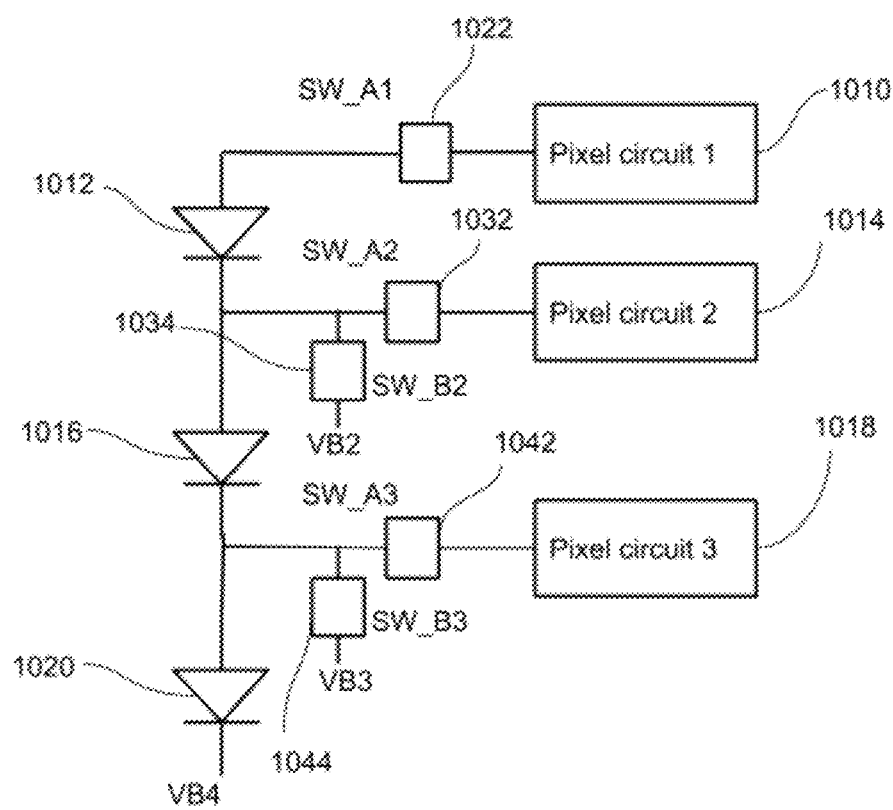
FIG. 10A-10B show exemplary pixel structures with shared electrodes between different microdevices and switches, in accordance with an embodiment of the invention.
Figures 10B, 10C:
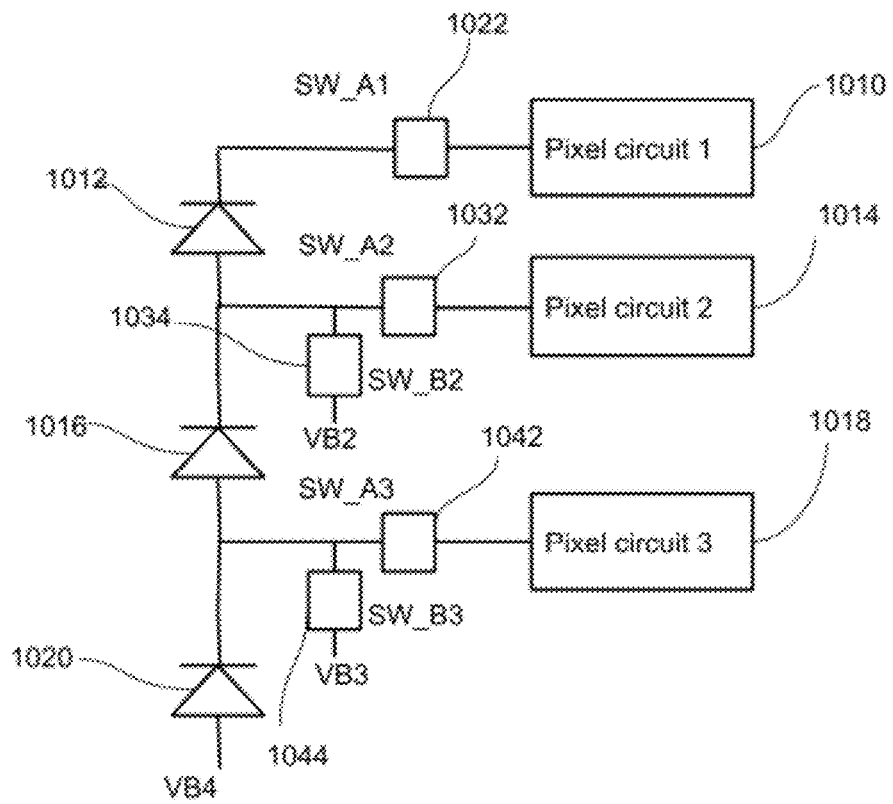
FIG. 10C-10D shows an example of switches operation during different operation period, in accordance with an embodiment of the invention.

FIGS. 10A and 10B show exemplary pixel structures with shared electrodes between different microdevices and switches to change the pixel configuration. With reference to FIGS. 10A and 10B, three microdevices 1012, 1016 and 1020 may be provided with corresponding pixel circuits 1010, 1014, and 1018. There may be provided a switch configuration 1022, 1032, 1034, 1042, 1044 to each device to either connect the device to a pixel circuit 1010, 1014, 1018 or to a bias voltage VB1, VB2, VB3. For example, switch 1022 is provided to device 1012, a voltage source VB2 coupled to switches 1032, 1034 is provided to device 1016, and a voltage source VB3 is coupled to switches 1042, 1044 and may be provided to device 1020.

In another embodiment, the pixel circuit 1010, 1014, and 1018 can be one pixel circuit and shared between the devices 1012, 1016 and 1020 and may be allocated to each device 1012, 1016 and 1020 for a given time during a frame time.

FIG. 10C shows an example of switch operation during different operation periods. Each device is connected to a pixel circuit and is in operation mode during at least a subframe of the frame time. During the operation mode, the switch connecting the device to the pixel circuit is ON and the switch biasing the other side of the device to a bias voltage is OFF. During other times in the frame, the device is not connected to the pixel circuit and unoperational. For unoperational mode, the device can be disconnected from the pixel circuit and both sides are either connected to a bias voltage or to at least one side is floating. The bias voltages are set to make sure the device is off.

Referring to FIG. 10C, during the first sub frame, the switches 1022, 1034, 1044 are ON and other switches 1032, 1042 are OFF. As a result, device 1012 is coupled to the pixel circuit 1010 and other devices 1016, 1020 are uncoupled from the pixel circuits 1014, 1018. Therefore, the device 1012 is operational and controlled by the pixel circuit 1010 and other devices 1016, 1020 are unoperational.

Referring to FIG. 10C, during the second sub frame, the switches 1032, 1044 are ON and other switches 1022, 1034, 1042 are OFF. As a result, device 1016 is coupled to the pixel circuit 1014 and other devices 1012, 1020 are uncoupled from the pixel circuits 1010, 1018. Therefore, the device 1016 is operational and controlled by the pixel circuit 1014 and other devices 1012, 1020 are unoperational.

Referring to FIG. 10C, during the third sub frame, the switches 1042, 1034 are ON and other switches 1022, 1044, 1032 are OFF. As a result, device 1020 is coupled to the pixel circuit 1018 and other devices 1012, 1016 are uncoupled from the pixel circuits 1010, 1018. Therefore, the device 1020 is operational and controlled by the pixel circuit 1018 and other devices 1012, 1016 are unoperational.

Figures 10D, 10E:
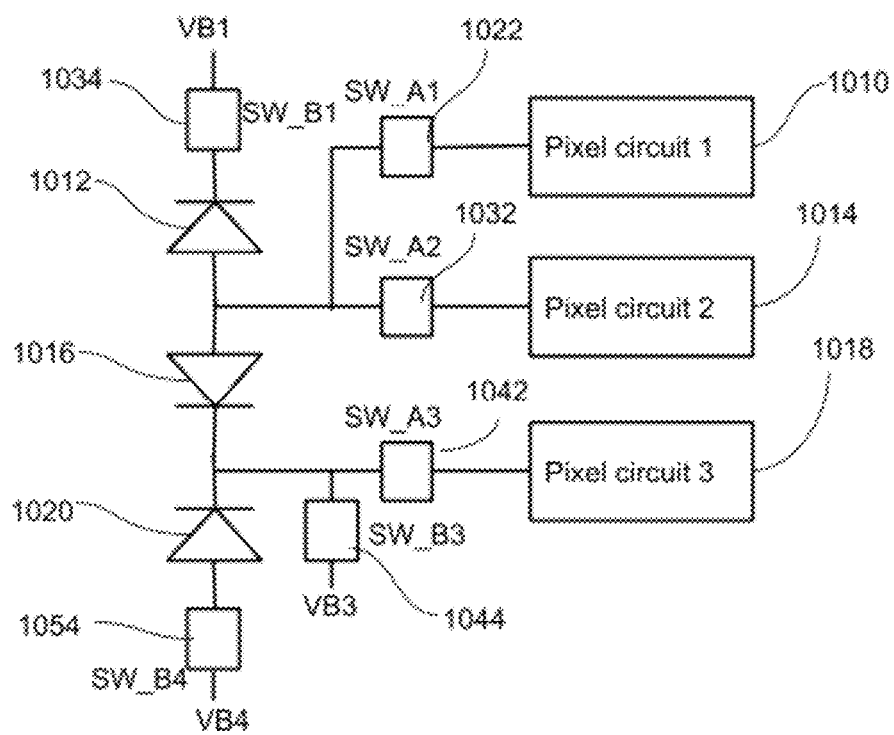
FIG. 10E shows another embodiment which performs similar to FIGS. 10A and 10B, in accordance with an embodiment of the invention.

Referring to FIG. 10D, the ON time of each device is extended and at least two devices are operational during one sub frame. During the first and third sub frame, devices 1012 and 1020 are operational and controlled by pixel circuit 1010, 1018 and device 1016 is unoperational. During the second and fourth subframe, device 1016 is coupled to 1020 and other devices 1012, 1020 are unoperational. One can combine the first and third subframes and combine the second and the fourth subframes.

FIG. 10E shows another embodiment which performs similar to FIGS. 10A and 10B. However, the two-pixel circuits 1010, 1014 are connected to the same point shared between two devices 1012 and 1016. Here, one can merge the two circuits 1010, 1014 and can eliminate the switches 1022, 1032. The operation of this pixel and device arrangement can be similar to that of FIGS. 10C, and 10D.

Figure 11A:
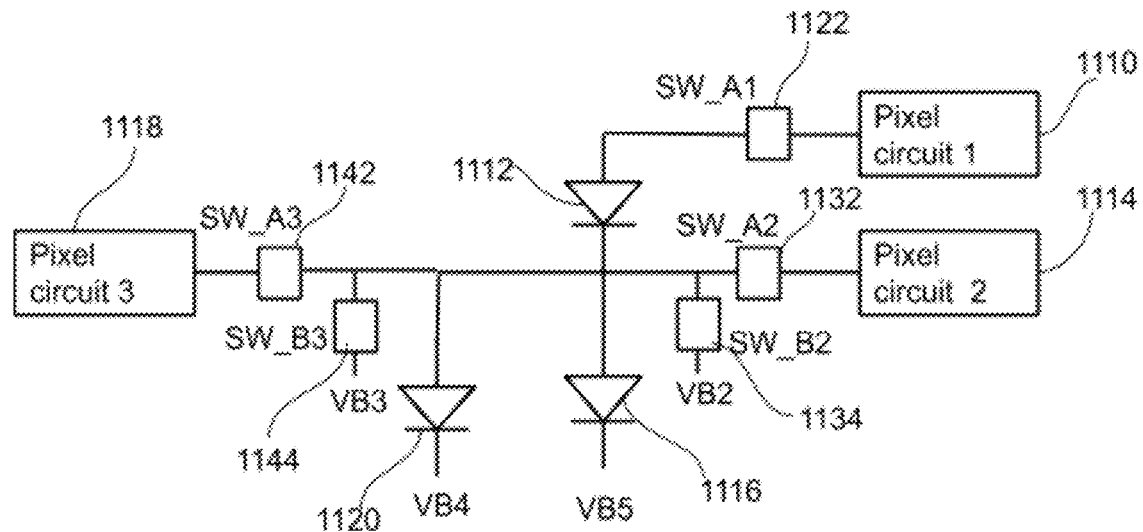
FIG. 11A-11B show exemplary pixel structures where more than two microdevices share the same contact/electrode, in accordance with an embodiment of the invention.
Figure 11B:
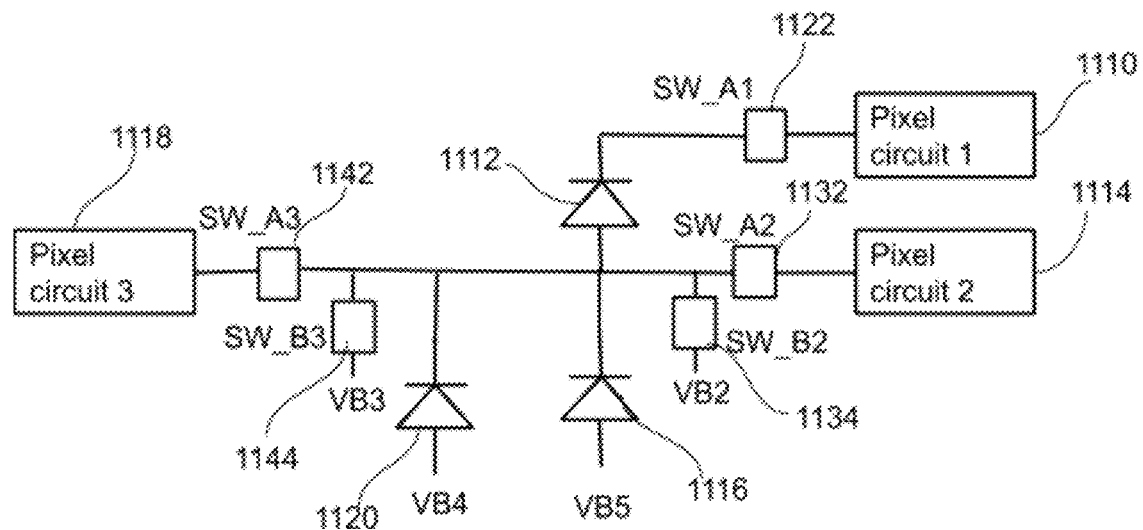

FIGS. 11A-11B show other embodiments where more than two microdevices share the same contact/electrode, according to one embodiment of the present invention. With reference to FIGS. 11A and 11B, three microdevices 1112, 1116, 1120 may be provided with corresponding pixel circuits 1110, 1118, 1114. There may be provided a switch configuration 1142, 1144, 1132, 1122 to either connect the device 1112, 1116, 1120 to pixel circuits 1110, 1118, 1114, or to a bias voltage VB3, VB2, VB4, VB5. For example, switch 1142 is provided to device 1120 and pixel circuit 1118, a voltage VB3 is coupled to switch 1144, switch 1132 is provided to device 1116 and pixel circuit 1114, a voltage source VB2 is coupled to switch 1134, and switch 1122 is provided to device 1112 and pixel circuit 1110. Here, the two-pixel circuits 1118, 1114 are connected to the same point shared between two devices 1118 and 1116.

In some embodiments, the pixel circuit can be one-pixel circuit and shared between the devices and may be allocated to each device for a given time during a frame time.

Figure 12A:
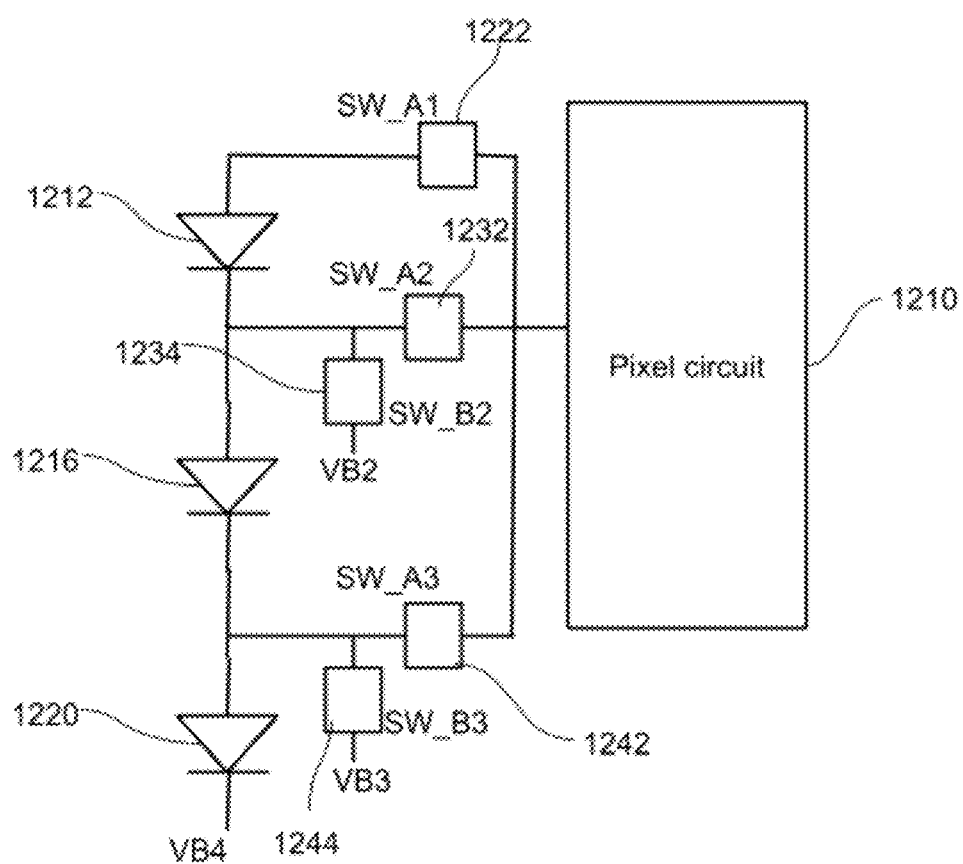
FIG. 12A-12B show exemplary pixel structures where more than two microdevices share the same contact/electrode, in accordance with an embodiment of the invention.
Figure 12B:
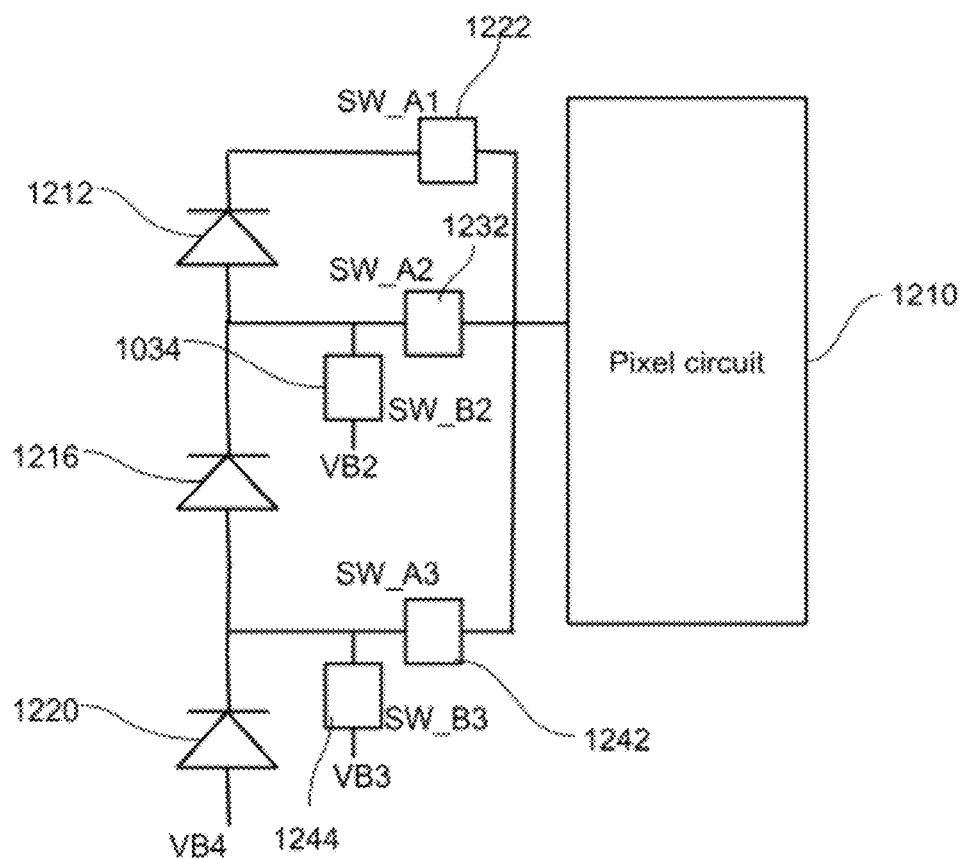

With reference to FIGS. 12A and 12B, a pixel structure shared between different microdevices may be provided. In these embodiments, three micro devices 1212, 1216, and 1220 share a common pixel 1210. There may be provided a switch configuration 1222, 1232, 1234, 1242, 1244 to either connect the devices 1212, 1216, 1220 to the common pixel circuit 1210 or to a bias voltage VB3, VB2. Here, the common pixel circuit 1210 may be allocated to each microdevice for a given time during a frame time.

Figure 13A:
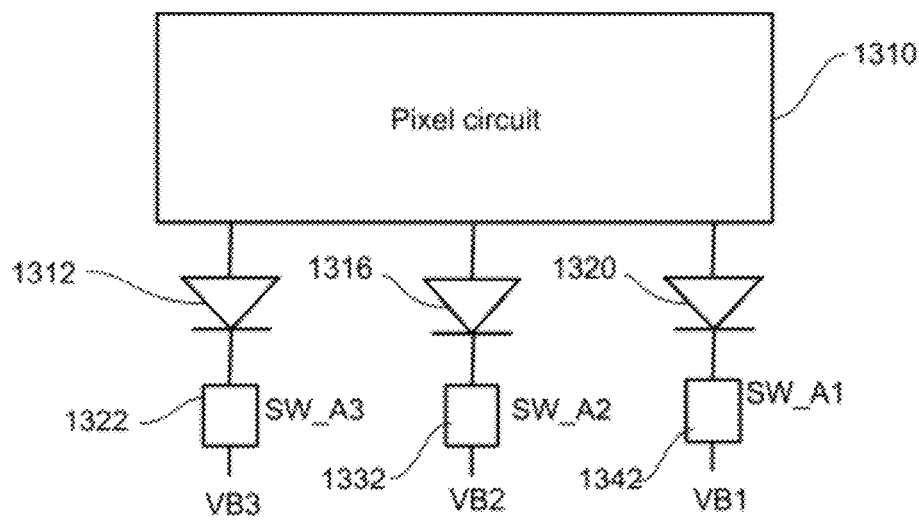
FIG. 13A-13B show exemplary pixel structures, in accordance with an embodiment of the invention.
Figure 13B:
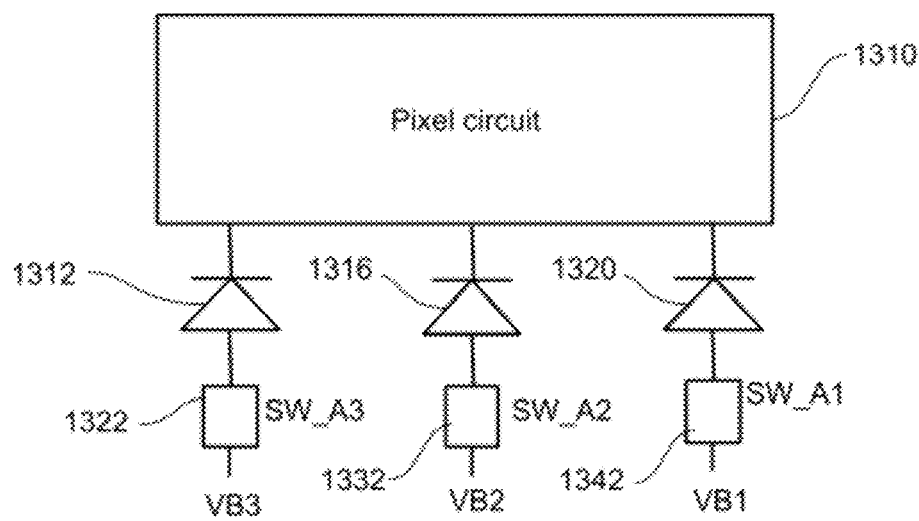

With reference to FIGS. 13A and 13B, a pixel structure shared between different microdevices may be provided. In these embodiments, three micro devices 1312, 1316, and 1320 may share a common pixel circuit 1310. There may be provided a switch configuration 1322, 1332, 1334 to connect the devices 1312, 1316, and 1320 to the common pixel circuit 1310 and to a bias voltage VB1, VB3, VB2. Here, the common pixel circuit 1310 may be allocated to each microdevice for a given time during a frame time.

Figure 14A:
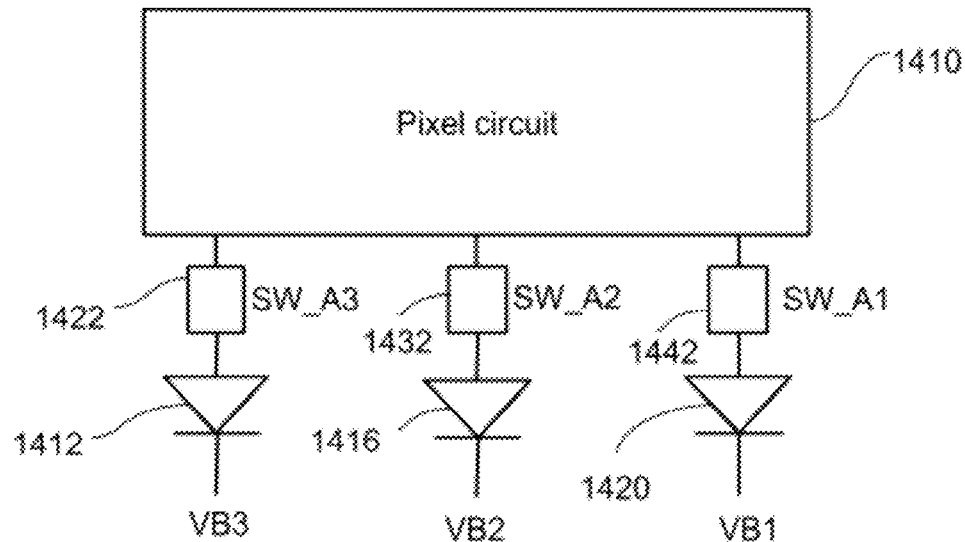
FIG. 14A-14B show exemplary pixel structures, in accordance with an embodiment of the invention.
Figure 14B:
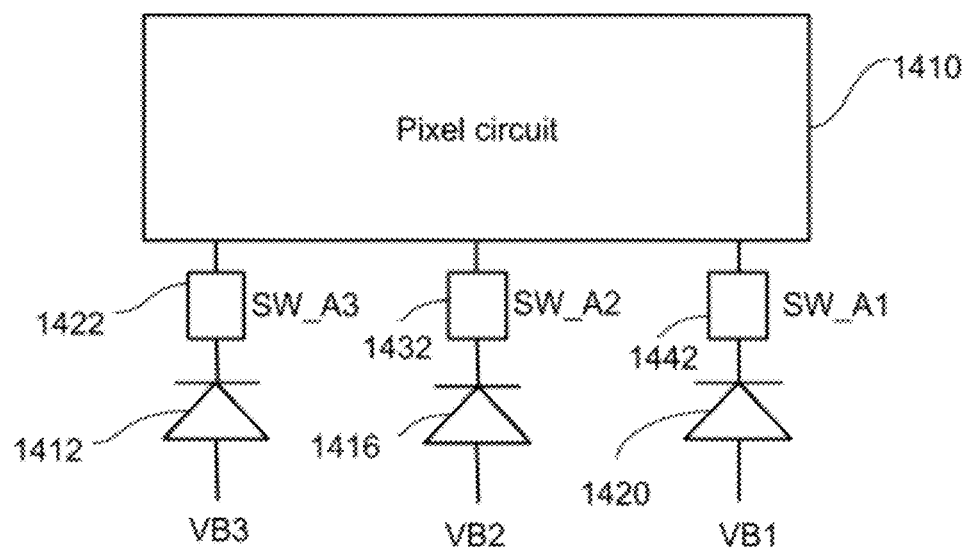

With reference to FIGS. 14A and 14B, a pixel structure shared between different microdevices may be provided. In these embodiments, three micro devices 1412, 1416, and 1420 share a common pixel circuit 1410. There may be provided a switch configuration 1422, 1432, 1434 connected between the common pixel circuit 1410 and the devices 1412, 1416, and 1420 connected to a bias voltage VB1, VB3, VB2.

Figure 15A:
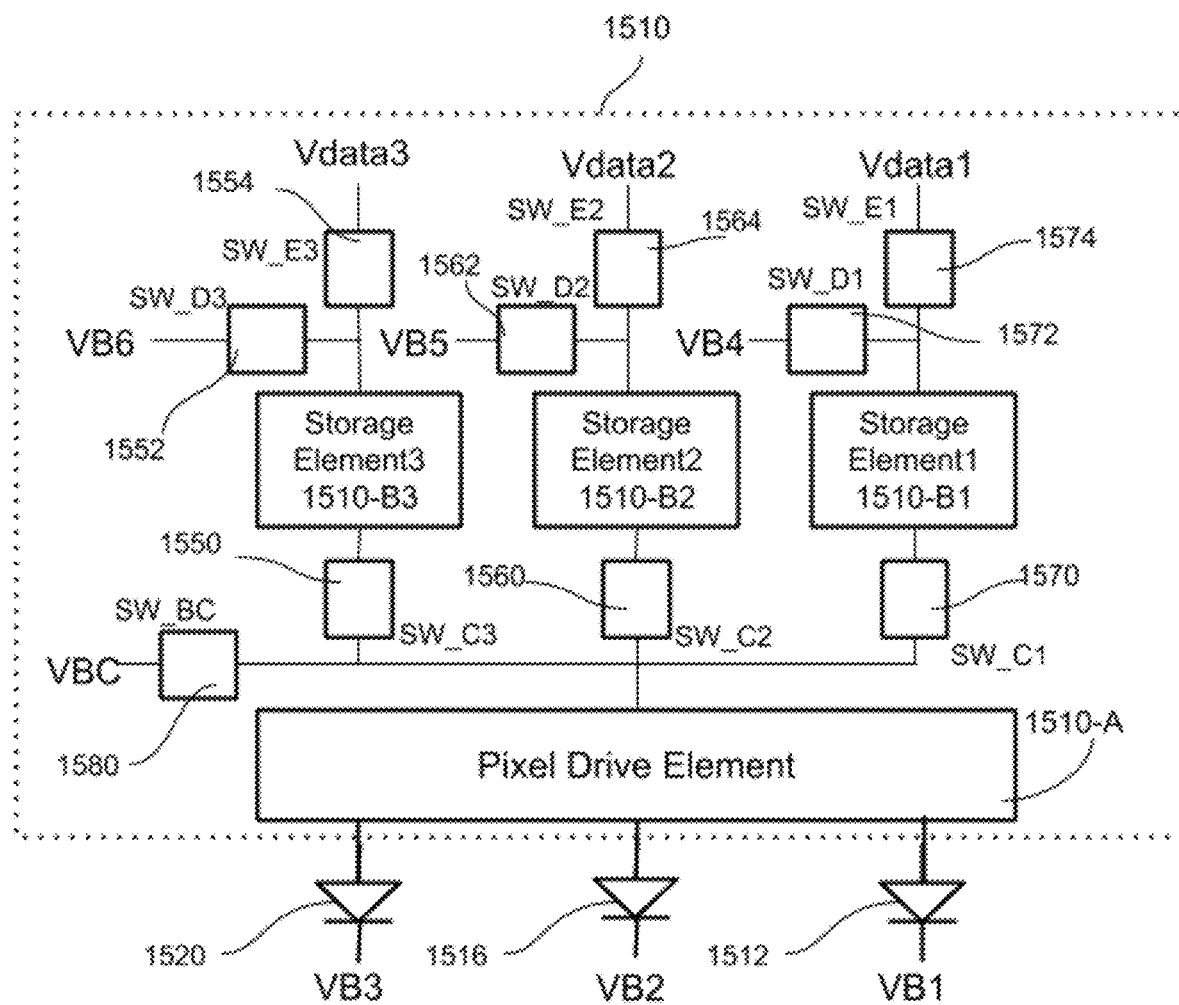
FIG. 15A shows a pixel diagram with shared drive/sense element and separated storage element for different microdevices, in accordance with an embodiment of the invention.

With reference to FIG. 15A, a pixel diagram with shared drive and separated storage element for different microdevices may be provided. Here VDATA signals (VDATA1-VDATA3) provide data voltage to the pixel circuit for programming the pixel with data in the form of voltage for the microdevice. With reference to FIG. 15A, three storage element 1510-B1, 1510-B2 and 1510-B3 may be provided with a common pixel element 1510-A. There may be provided a switch configuration 1550, 1560 and 1570 to each storage element to either connect with common pixel element 1510-A or to a common bias voltage VBC through another switch 1580. There may be provided another switch configuration 1572, 1574, 1562, 1564, 1552, 1554 to connect storage elements 1510-B1, 1510-B2 and 1510-B3 with individual bias voltage VB4, VB5 and VB6. The common pixel drive element 1510-A may be connected to microdevices 1512, 1516, 1520 which are connected to corresponding bias voltages VB1, VB2 and VB3.

With reference to FIG. 15B, the switching configuration during different operation periods may be provided. Each storage element is connected to a common pixel driver and is in operation mode during at least a subframe of the frame time. During operation mode, the switch connecting the storage element to the pixel driver element is ON and the switch biasing the other side of the storage element to a bias voltage is ON. During other times in the frame, the storage element is not connected to the pixel driver element and is unoperational. For unoperational mode, the storage element can be disconnected from the pixel driver element and both sides are either connected to a bias voltage or at least one side is floating. The bias voltages are set to make sure the storage element is OFF.

In FIG. 15B, during the first subframe, the switches 1570, 1560, 1550, 1574, 1564, 1580 and 1554 are ON, whereas the switches 1572, 1562, and 1552, are OFF. As a result, all the storage elements 1510-B1, 1510-B2 and 1510-B3 are operational. During the second subframe of FIG. 15B, the switches 1580, 1560, 1550, 1574, 1562, 1564, 1552 and 1554 are OFF, whereas the switches 1570 and 1572 are ON. As a result, only the first storage element 1510-B1 is in operation and coupled to pixel driver element, whereas other storage elements 1510-B2 and 1510-B3 are uncoupled from pixel driver elements and are unoperational.

During the third subframe of FIG. 15B, the switches 1580, 1570, 1550, 1574, 1572, 1564, 1552 and 1554 are OFF, whereas the switches 1560 and 1562 are ON. As a result, only the second storage element 1510-B2 is in operation and coupled to pixel driver element 1510-A, whereas other storage elements 1510-B1 and 1510-B3 are uncoupled from pixel driver elements and are unoperational.

During the fourth subframe of FIG. 15B, the switches 1580, 1570, 1560, 1574, 1572, 1564, 1562 and 1554 are OFF, whereas the switches 1550 and 1552 are ON. As a result, only the third storage element 1510-B3 is in operation and coupled to pixel driver element 1510-A, whereas other storage elements 1510-B1 and 1510-B2 are uncoupled from pixel driver elements and are unoperational.

Subframes two to four (FIG. 15B) can be repeated during different operation periods so that different switches are ON for each subframe, and therefore storage elements are in operation during each subframe.

Figure 16A:
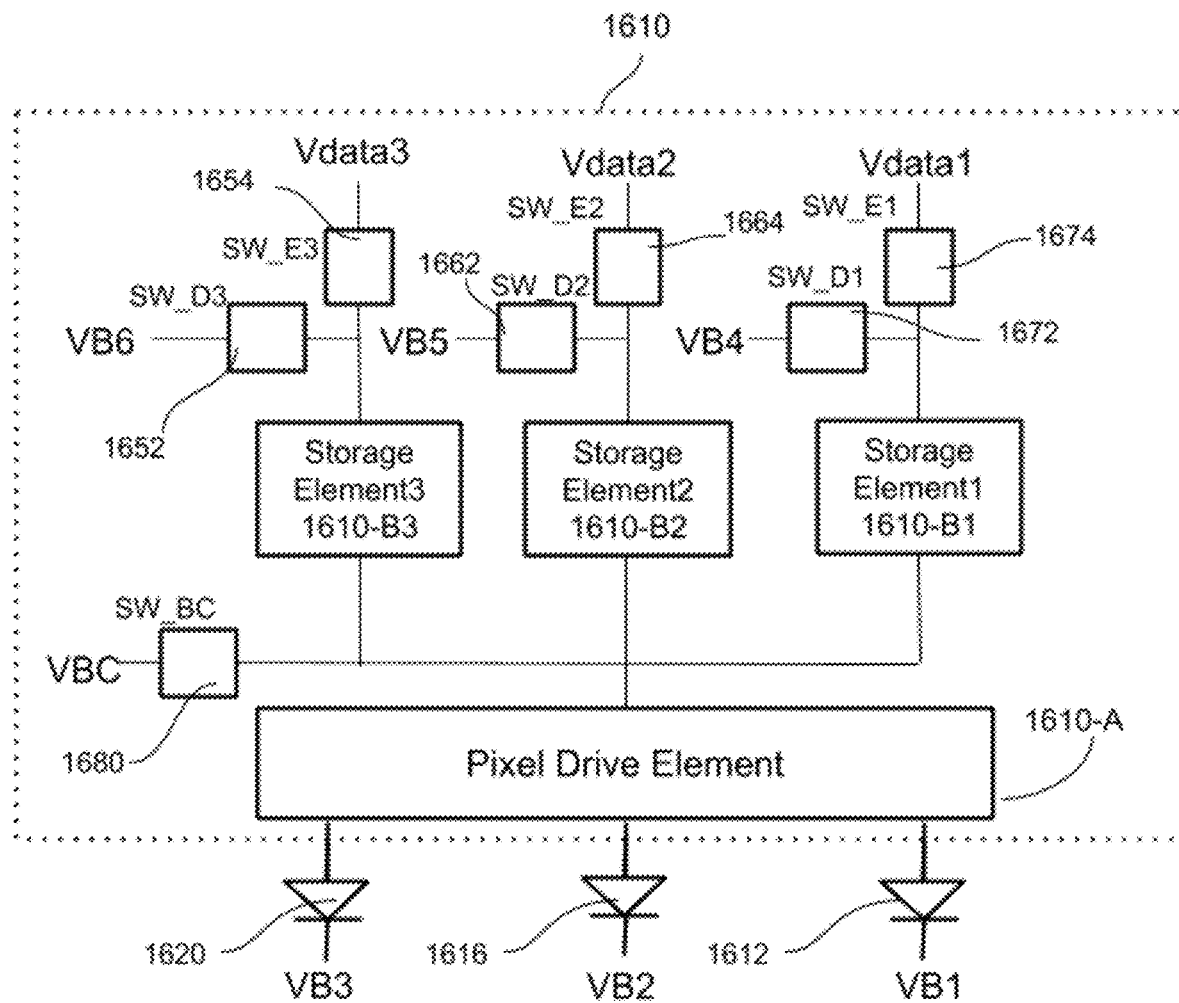
FIG. 16A shows another pixel block diagram with shared drive/sense element and separated storage element for different microdevices, in accordance with an embodiment of the invention.

With reference to FIG. 16A, a pixel diagram with shared drive and separated storage element for different microdevices may be provided. Here VDATA signals (VDATA1-VDATA3) provide data voltage to the pixel circuit for programming the pixel with data in the form of voltage for the microdevice. With reference to FIG. 16A, three storage element 1610-B1, 1610-B2 and 1610-B3 may be provided with a common pixel element 1610-A. There may be provided a switch configuration 1680 to either connect each storage element 1610-B1, 1610-B2 and 1610-B3 to with common pixel element 1610-A or to a common bias voltage VBC. The storage element may comprise capacitors. There may be provided another switch configuration 1672, 1674, 1662, 1664, 1652, 1654 to connect storage elements 1610-B1, 1610-B2 and 1610-B3 with individual bias voltage VB4, VB5 and VB6. The common pixel drive element 1610-A may be connected to microdevices 1612, 1616, 1620 which are connected to corresponding bias voltages VB1, VB2 and VB3.

In FIG. 16B, during the first subframe, the switches 1680, 1674, 1664, and 1654 ON, whereas the switches 1672, 1662, and 1652, are OFF. As a result, all the storage elements 1610-B1, 1610-B2 and 1610-B3 are operational. During the second subframe of FIG. 16B, the switches 1680, 1674, 1664, 1654, 1662 and 1652 are OFF, whereas the switch 1672 is ON. As a result, only the first storage element 1610-B1 is in operation and coupled to pixel driver element, whereas other storage elements 1610-B2 and 1610-B3 are uncoupled from pixel driver elements and are unoperational.

During the third subframe of FIG. 16B, the switches 1680, 1674, 1664, 1654, 1672, 1652 are OFF, whereas the switch 1662 is ON. As a result, only the second storage element 1610-B2 is in operation and coupled to pixel driver element 1610-A, whereas other storage elements 1610-B1 and 1610-B3 are uncoupled from pixel driver elements and are unoperational.

During the fourth subframe of FIG. 16B, the switches 1680, 1674, 1664, 1654, 1672 and 1672 are OFF, whereas the switches 1652 is ON. As a result, only the third storage element 1610-B3 is in operation and coupled to pixel driver element 1610-A, whereas other storage elements 1610-B1 and 1610-B2 are uncoupled from pixel driver elements and are unoperational.

Subframes two to four (FIG. 16B) can be repeated during different operation periods so that different switches, and therefore storage element, are in operation for each subframe.

Tile Stacking for Optoelectronic System

Some embodiments of the present disclosure relate to tiled display device and more particularly, to stacking tiles to a backplane to form the tiled display device.

Here, different color microLEDs are used to explain the invention. However, different microdevices can be used instead of colored microLEDs.

According to one embodiment, there is provided a method of stacking tile structure layers to a substrate, each tile structure layer comprising plurality of microdevices, the method comprising: releasing a first tile structure layer on the substrate, providing and aligning a second tile structure layer with the first tile structure layer on the substrate; and bonding the first tile structure layer and the second tile structure layer on the substrate, wherein the first tile structure and the second tile structure are physically separated from each other.

In one embodiment, a tile structure may comprise one or more microdevices transferred onto a carrier substrate.

In another embodiment, a buffer layer may be formed on the carrier substrate before transferring the microdevices to the substrate. The buffer layer can be a release layer, a supporting substrate, or a backplane layer.

In another embodiment, the microdevices are planarized. The planarization layer is patterned or etch backed to open a connection to the microdevices.

In another embodiment, a first tile structure layer is released from the carrier substrate. Extra processing steps can be performed after the first tile structure layer transfer. For example, traces or bumps can be formed.

In another embodiment, a second tile structure layer is aligned with the first tile structure layer either through alignment mark or through the other structure in the first and the second tile structures layers.

In one embodiment, the second tile structure layer is then bonded to the first tile structure layer through the means of adhesive layer or bonding pads.

In another embodiment, vias can be formed through the tile structure layers to connect them together or provide connection to connect different layers to a backplane.

In one embodiment, the system substrate is bonded at the top of the tile structure. In one case, the substrate may be bonded at a bottom side of the tile structure.

In another embodiment, the backplane and substrate may be prepared separately from the tiles and then bond together. In another embodiment, the backplane is flexible between the tiles.

To improve surface profile, in one embodiment, the planarization layer is patterned at some areas to provide dents for bonding microdevices from the other tile layer structures.

In another embodiment, driving circuitry may form on the substrate prior to stacking of the tile layers. Here, vias/openings can be used to connect the tiles to the driving circuitry. The driving circuitry can be pixel circuits. Planarization and protection layer may be formed after the driving circuitry for preparing the surface for integration of stacked tile structure. The driving circuitry can be also a tile structure transferred to the substrate.

In one embodiment, there can be common electrode between each tile connecting one terminal of the devices together. The common electrode can be at multiple tiles or at the final common metalization layer.

In one case, the bonding layers may be formed between the tile layers for enabling integration of microdevices. The bonding layers can be adhesive or bonding pads. The adhesive can be different materials such as SU8, Polyamide, UV or thermal curable epoxy. The bonding pads can be Au/In or Au/Au or other materials compatible with compression, thermal compression, eutectic and bonding methods.

Each tile structure can be tested prior to stacking and the tile structure that meets some threshold in terms of performance and yield will be stacked.

Figure 17:
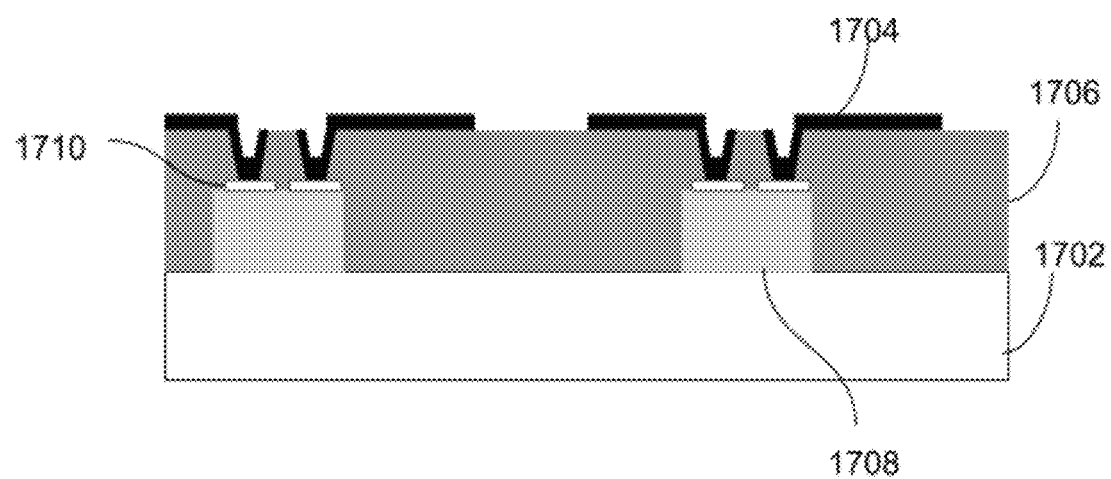
FIG. 17 shows a cross section of single-color tile structure with top metalization, in accordance with an embodiment of the invention.

FIG. 17 shows an embodiment of single-color tile structure with top metalization. To prepare a tile structure, one or more microdevices 1708 are transferred onto a carrier substrate 1702. These microdevices may be of same color. The color may be one of red, green or blue. A buffer layer may be formed on the substrate 1702 before transferring the microdevices to the substrate 1702. The buffer layer can be a release layer, a supporting substrate, or a backplane layer. It can include some optical layer as well. Each of the microdevices may be provided with contact pads or ohmic contacts 1710 over a surface of the microdevices. The microdevices 1708 are planarized. Other processing step can be performed after the planarization layer. For example, the planarization layer 1706 is patterned or etch backed to open a connection to the microdevices 108. In another case, the planarization layer 1706 is etched back to expose the top of the microdevices 1708. The openings/vias may be made through the planarization layer 1706 to provide metalization 1704 for traces and bridges. One of the traces can be a common electrode.

Figure 18:
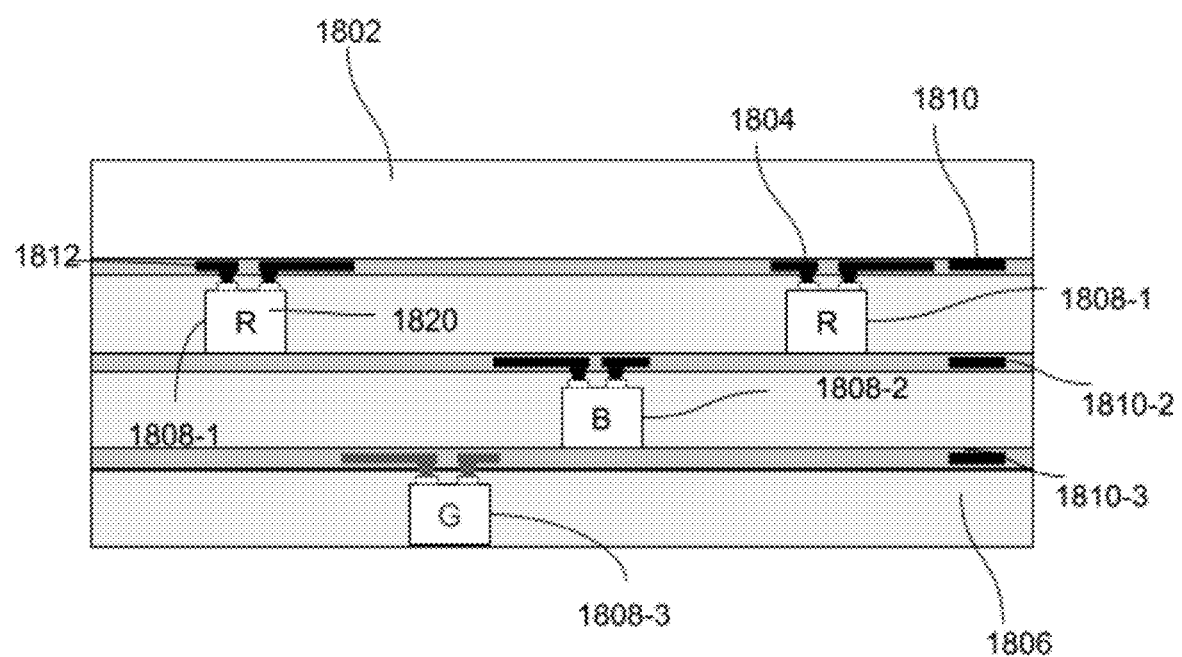
FIG. 18 shows a stacked tile structure bonded to a system (or temporary) substrate, in accordance with an embodiment of the invention.

FIG. 18 shows a stacked tile bonded to a system (or temporary) substrate. Here, a tile structure layer is prepared where microdevices are transferred into a carrier substrate. The tile structure layer may be covered with planarization layers and other metalization layers. Other layers can be used such as support substrate layer or release layer. The first tile structure layer is bonded to the substrate through application of adhesive layer or bonding pads between the tile and the substrate. Then, the first tile structure layer is released from the carrier substrate. Extra processing steps can be performed after the first tile structure layer transfer. For example, traces or bumps can be formed. Then the second tile structure layer is aligned with the first tile structure layer either through alignment mark or through the other structure in the first and the second tile structures layers. The second tile structure layer is then bonded to the first tile structure layer through the means of adhesive layer or bonding pads. The process of stacking can continue for adding more functional microdevice tile structure layers into the substrate. Via can be formed through the tile structure layers to connect them together or provide connection to connect different layers to a backplane.

The substrate 1802 may be one of: a stacking substrate, a system substrate, a temporary substrate or a backplane. Here, the first tile layer structure having microdevices e.g. 1820, 1808-1 released from the carrier substrate to the substrate 1802. Extra processing steps can be performed after the first tile structure layer transfer. For example, traces or bumps can be formed. Then, a second tile layer structure having microdevices e.g., 1808-2 released from other carrier substrate and aligned with the first tile layer structure through alignment mark (1810, 1810-2) or through the other structure in the first and the second tile structures layers. The second tile structure layer is then bonded to the first tile structure layer through the means of adhesive layer or bonding pads. Further, a third tile structure having microdevices e.g., 1808-3 released from other carrier substrate and aligned with bonded the first tile layer structure and the second tile layer structure through alignment mark (1810, 1810-2 and 1810-3) or through the other structure in the first, second or third tile structures layers. The third tile structure layer is then bonded to the first and second tile structure layer through the means of adhesive layer or bonding pads. The process of stacking can continue for adding more functional microdevice tiles into the substrate. Vias can be formed through the tiles to connect them together. In one embodiment, the first microdevice tile and the second microdevice tile and subsequent tiles are physically separated from one another.

Here, the substrate is bonded at the top of the tile structure. In one case, the substrate may be bonded at a bottom side of the tile structure.

In one embodiment, the backplane and substrate may be prepared separately from the tiles and then bond together. In another embodiment, the backplane is flexible between the tiles.

Figure 19A:
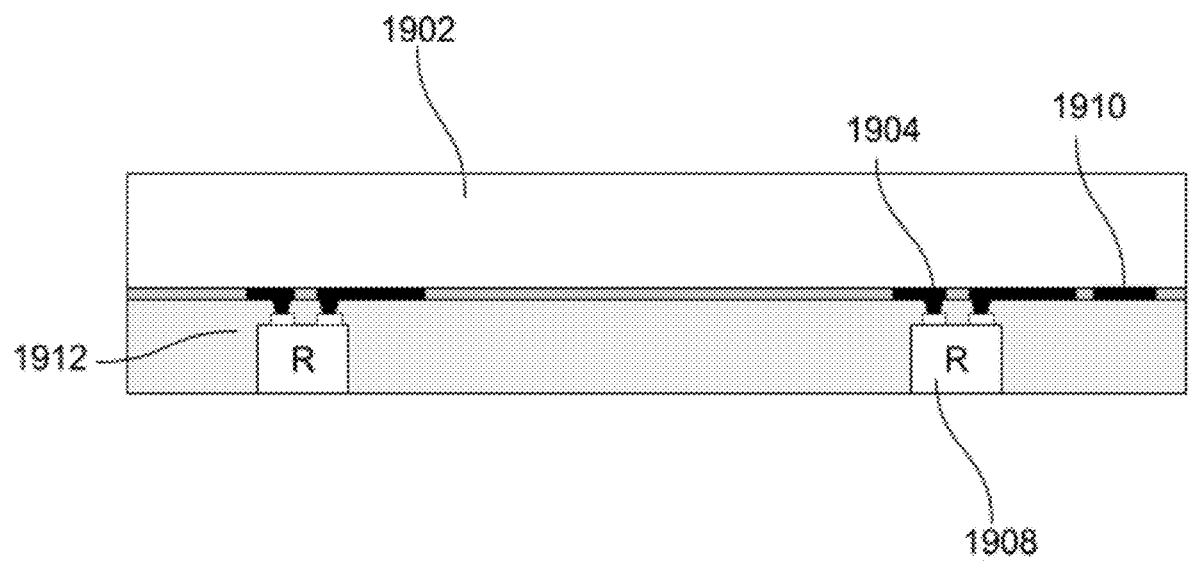
FIG. 19A shows cross section of transferring of a first tile layer structure to a substrate, in accordance with an embodiment of the invention.

FIG. 19A shows cross section of transferring of a first tile layer structure to a system substrate. Here, a first tile layer structure is bonded to a system (or temporary) substrate 1902. The first tile structure layer is released from the carrier substrate. The first tile structure layer is prepared where microdevices are transferred into the carrier substrate. The transferred tile structure layer may be covered with planarization layers 1912 and other metalization layers 1904. The first tile structure layer is bonded to the system substrate 1902 through application of adhesive layer or bonding pads between the tile and the substrate. Traces or bumps can also be formed. An alignment mark 1910 may be provided in the tile structure for the purpose of aligning with subsequent tiles with the first tile structure.

Figure 19B:
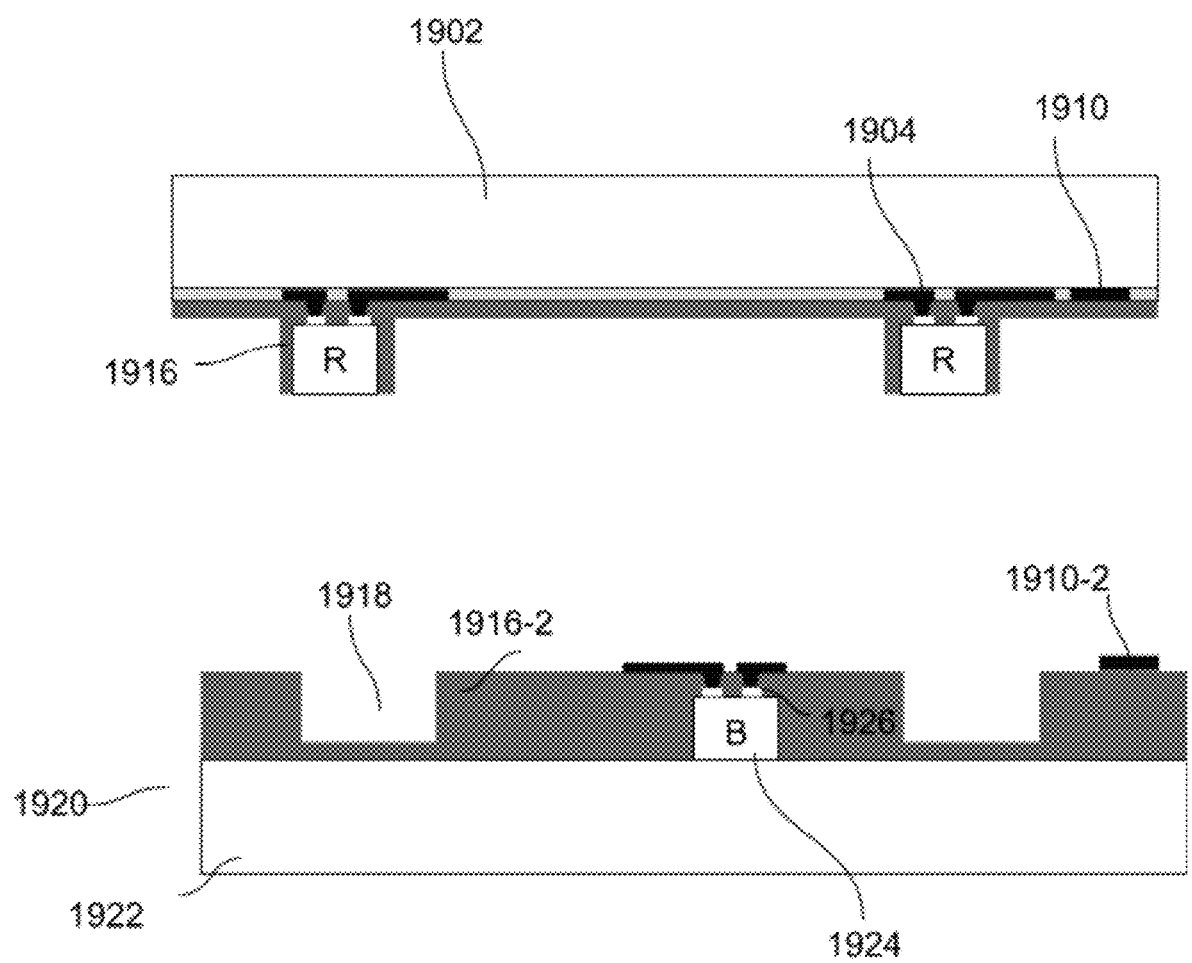
FIG. 19B shows cross section of patterning of the first tile layer structure and a second tile layer structure, in accordance with an embodiment of the invention.

FIG. 19B shows cross section of patterning of the first tile layer structure on the system substrate and a second tile layer structure. The first tile layer structure may be patterned. The planarization layer 1916 around the microdevices 1908 is patterned or etch backed to remove excess material on or around the microdevices to ease the bonding process.

A second tile layer structure 1920 may be provided on a carrier substrate 1922. A buffer layer may be formed on the substrate 1922 before transferring the microdevices 1924 to the substrate 1922. The buffer layer can be a release layer, a supporting substrate, or a backplane layer. It can include some optical layer as well. Each of the microdevices may be provided with contact pads or ohmic contacts 1926 over a surface of the microdevices. The microdevices 1924 are planarized. The planarization layer 1916-2 is patterned or etch backed to open a connection to the microdevices 1924. The openings/vias may be made through the planarization layer 1916-2 to provide metalization for traces and bridges.

To improve surface profile, in one embodiment, the planarization layer is patterned at some areas to provide dents 1918 for bonding microdevices from the other tile layer structures. An alignment mark 1910-2 may be provided in the second tile layer structure for the purpose of aligning with the first tile layer structure.

Figure 19C:
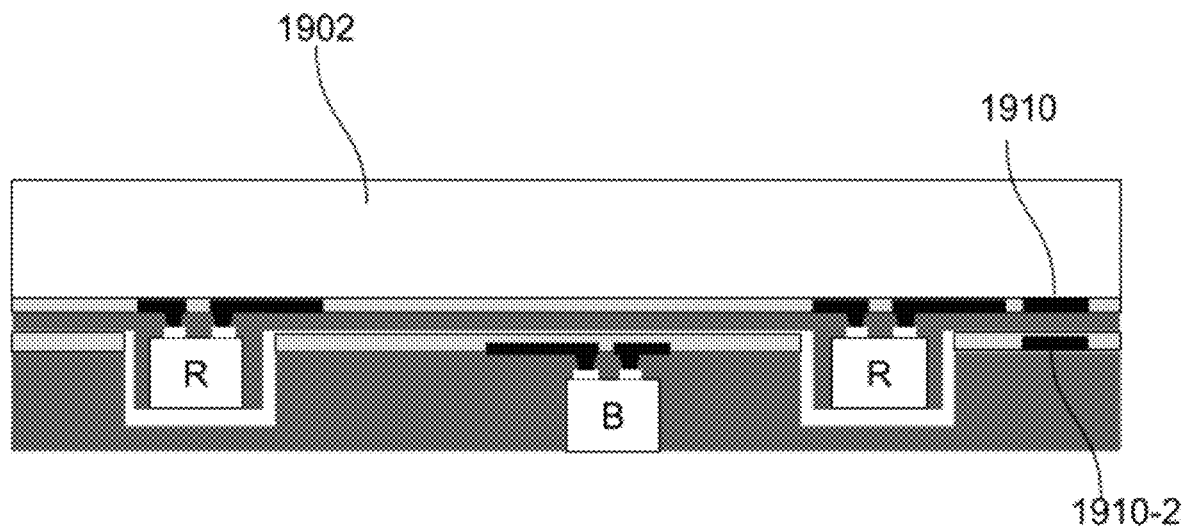
FIG. 19C shows a cross section of bonding the first tile and the second tile to the system substrate, in accordance with an embodiment of the invention.

FIG. 19C shows a cross section of bonding between the second tile and the first tile structure on the system substrate 1902. Here, the second tile layer structure is aligned with the first tile layer either through alignment marks (1910, 1910-2) or through the other structure in the first and second tile structure. The second tile is then bonded to the first tile through the means of adhesive or bonding pads. The process of stacking can continue for adding more functional microdevice tiles into the substrate. In one case, Via can be formed through the tiles to connect them together.

In one embodiment, there can be common electrode between each tile connecting one terminal of the devices together. The common electrode can be at multiple tiles or at the final common metalization layer. Optical structure can form on top of each microdevice at different tiles to allow better light coupling to outside or from outside world to the device. In one case, the optical structure can be vias with metal around the area over the microdevice to confine the light.

Figure 19D:
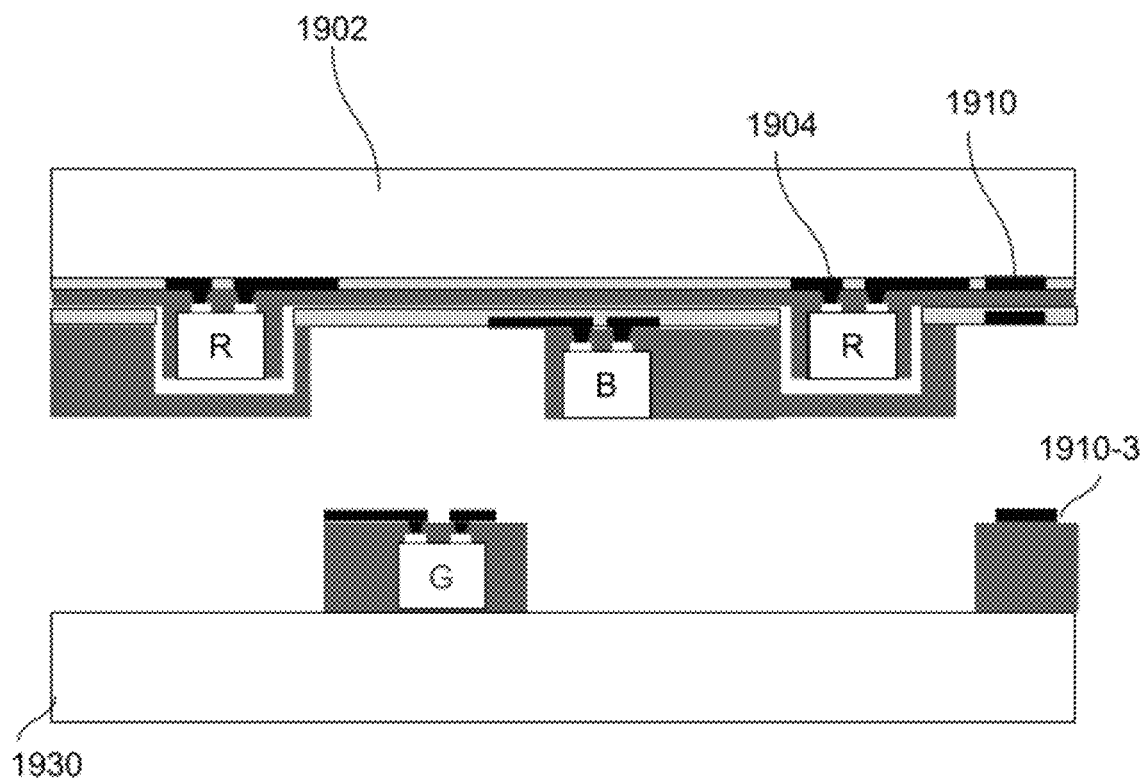
FIG. 19D shows cross section of patterning the second tile layer structure and a third tile layer structure, in accordance with an embodiment of the invention.

FIG. 19D shows cross section of patterning the second tile layer structure and a third tile layer structure. The bonded first and second tile layer structures may be patterned to remove excess material on and around the microdevices to ease the bonding process.

A third tile layer structure 1930 may be provided on a carrier substrate. Each of the microdevices may be provided with contact pads or ohmic contacts over a surface of the microdevices. The microdevices are planarized. The planarization layer 1916-3 is patterned or etch backed to open a connection to the microdevices 1924. The excessive planarization layer around the microdevices may be removed. An alignment mark 1910-3 may be provided in the third tile layer structure for the purpose of aligning with the bonded first and second tile layer structure.

Figure 19E:
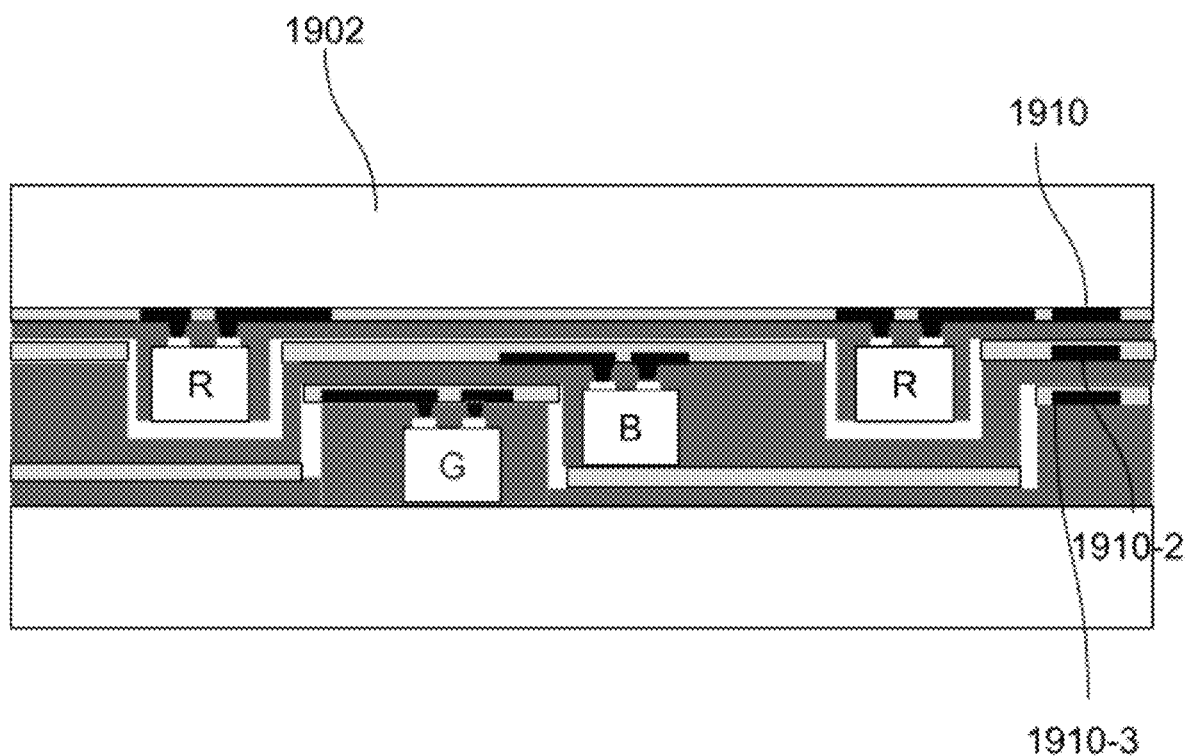
FIG. 19E shows cross section of bonding of the third layer structure to the system substrate, in accordance with an embodiment of the invention.

FIG. 19E shows cross section of bonding of the third layer structure to the system substrate. Here, the bonded first and second tile layer structure is aligned with the third tile layer either through alignment marks (1910, 1910-2, 1910-3) or through the other structure in the tile structures. The third tile is then bonded to the second and first tile through the means of adhesive or bonding pads. The process of stacking can continue for adding more functional microdevice tiles into the substrate. Via can be formed through the tiles to connect them together.

In one embodiment, driving circuitry may form on the substrate prior to stacking of the tile layers. Here, via/opening can be used to connect the tiles to the driving circuitry. The driving circuitry can be pixel circuits. Planarization and protection layer may be formed after the driving circuitry for preparing the surface for integration of stacked tile structure. The driving circuitry can be also a tile structure transferred to the substrate.

Figure 20A:
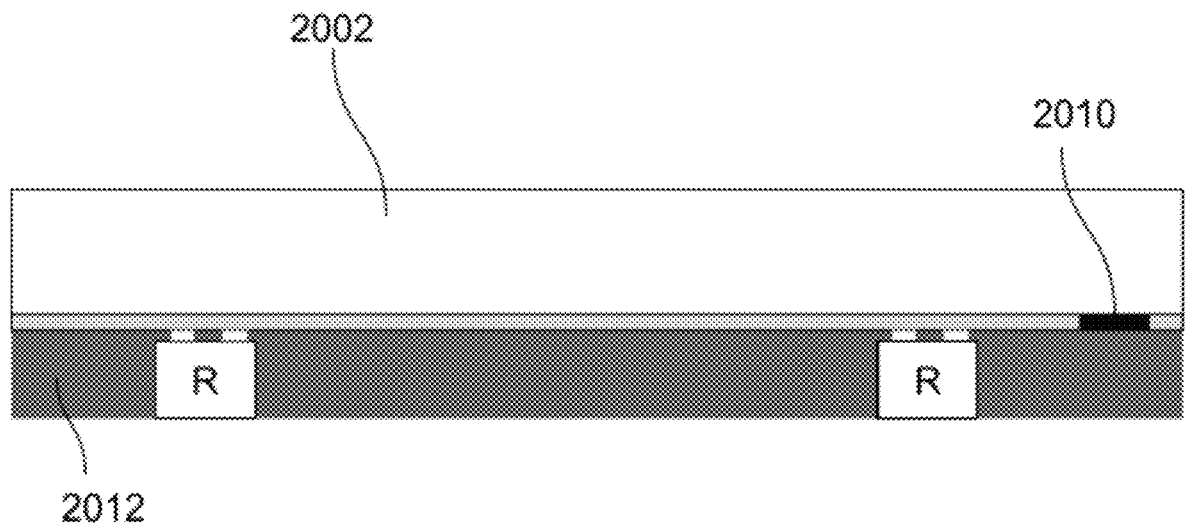
FIG. 20A shows cross section of transferring of a first tile layer structure without metallization to a substrate and vias formed through the tiles, in accordance with an embodiment of the invention.

FIG. 20A shows cross section of transferring of a first tile layer structure without metallization to a substrate and vias formed through the tiles and the backplane mounted to the top of the layers through via. Here, a first tile layer structure is bonded to a system (or temporary) substrate 2002. The first tile structure layer is released from the carrier substrate. The tile structure layer is prepared where microdevices are transferred into the carrier substrate. The transferred tile structure layer may be covered with planarization layers 2012. In this case, Vias may also be formed through the tiles and the backplane 2002 may be mounted to the top of the layers through vias. The first tile structure layer is bonded to the system substrate through application of adhesive layer or bonding pads between the tile and the substrate. Traces or bumps can also be formed. An alignment mark 2010 may be provided in the tile structure for the purpose of aligning with subsequent tiles.

Figure 20B:
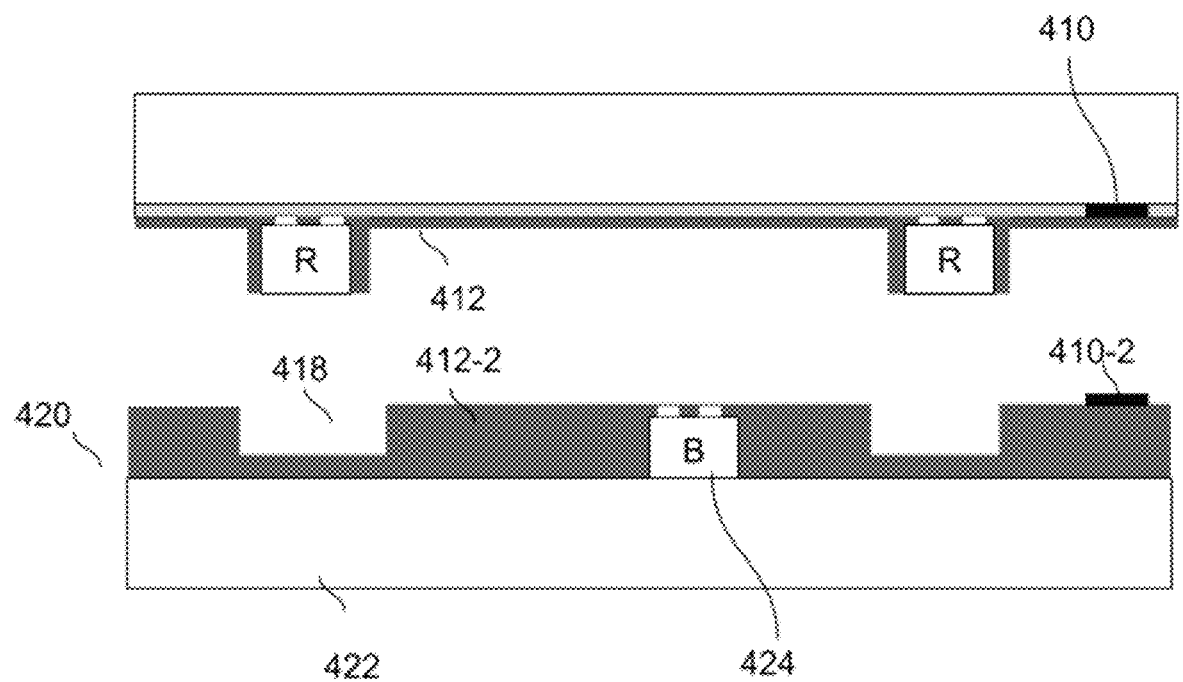
FIG. 20B shows cross section of patterning of a first tile layer structure and a second tile layer structure, in accordance with an embodiment of the invention.

FIG. 20B shows cross section of patterning of the first tile layer structure on the system substrate and a second tile layer structure. The first tile layer structure may be patterned. The planarization layer 2012 around the microdevices is patterned or etch backed to remove excess material on or around the microdevices to ease the bonding process.

A second tile layer structure 2020 may be provided on a carrier substrate 2022. A buffer layer may be formed on the substrate 2022 before transferring the microdevices 2024 to the substrate 2022. The buffer layer can be a release layer, a supporting substrate, or a backplane layer. It can include some optical layer as well. Each of the microdevices may be provided with contact pads or ohmic contacts over a surface of the microdevices. The microdevices 2024 are planarized. In one embodiment, the planarization layer is patterned at some areas to provide dents 2018 for bonding microdevices from the other tile layer structures. An alignment mark 2010-2 may be provided in the second tile layer structure for the purpose of aligning with the first tile layer structure.

Figure 20C:
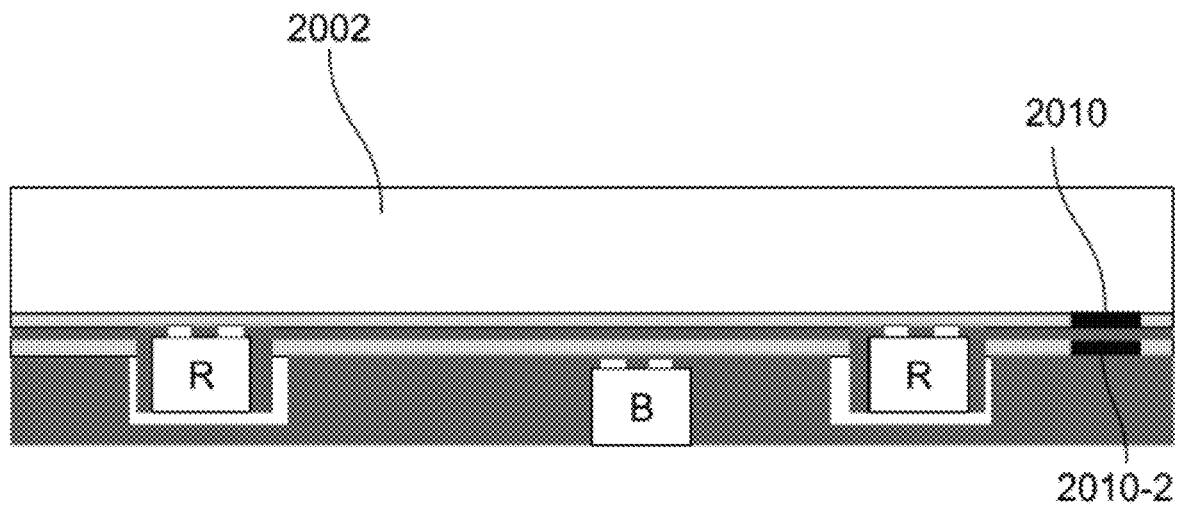
FIG. 20C shows a cross section of bonding the first tile and the second tile to the system substrate, in accordance with an embodiment of the invention.

FIG. 20C shows a cross section of bonding between the second tile and the first tile structure on the system substrate 2002. Here, the second tile layer structure is aligned with the first tile layer either through alignment marks (2010, 2010-2) or through the other structure in the first and second tile structure. The second tile is then bonded to the first tile through the means of adhesive or bonding pads. The process of stacking can continue for adding more functional microdevice tiles into the substrate. In one case, Via can be formed through the tiles to connect them together.

In one embodiment, there can be common electrode between each tile connecting one terminal of the devices together. The common electrode can be at multiple tiles or at the final common metalization layer. Optical structure can form on top of each microdevice at different tiles to allow better light coupling to outside or from outside world to the device. In one case, the optical structure can be vias with metal around the area over the microdevice to confine the light.

Figure 20D:
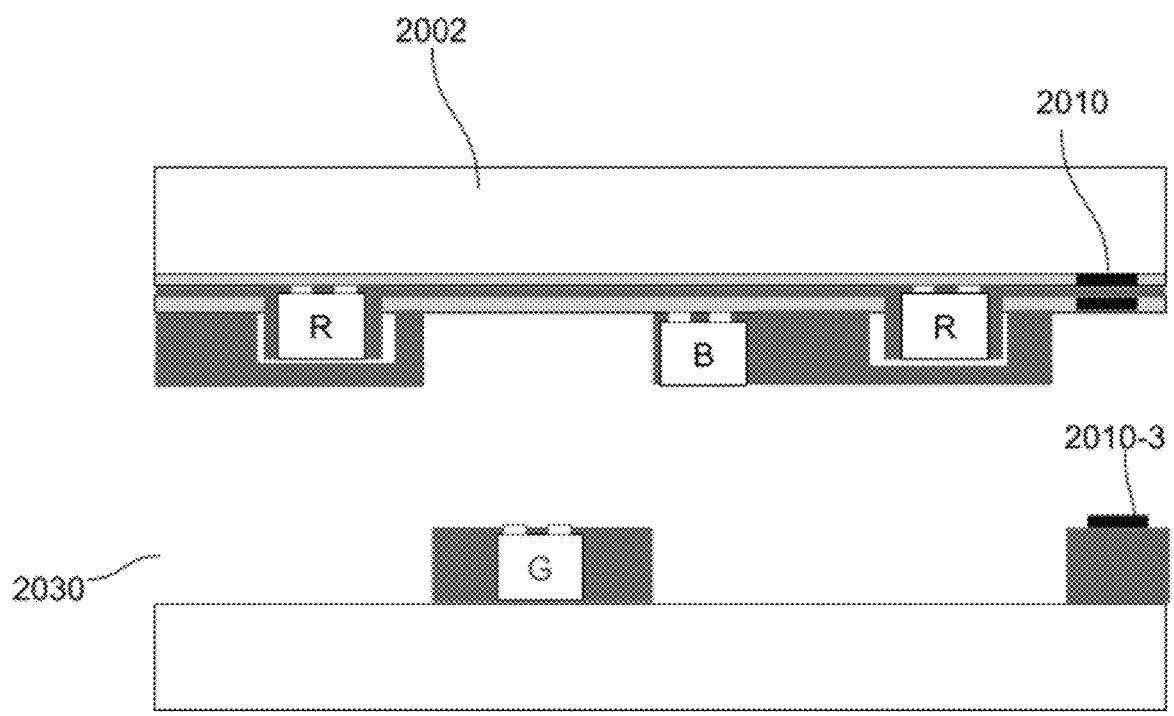
FIG. 20D shows cross section of patterning the second tile layer structure and a third tile layer structure, in accordance with an embodiment of the invention.

FIG. 20D shows cross section of patterning the second tile layer structure and a third tile layer structure. The bonded first and second tile layer structures may be patterned to remove excess material on and around the microdevices to ease the bonding process.

A third tile layer structure 2030 may be provided on a carrier substrate. Each of the microdevices may be provided with contact pads or ohmic contacts over a surface of the microdevices. The microdevices are planarized. The excessive planarization layer around the microdevices may be removed. An alignment mark 2010-3 may be provided in the third tile layer structure for the purpose of aligning with the bonded first and second tile layer structure.

Figure 20E:
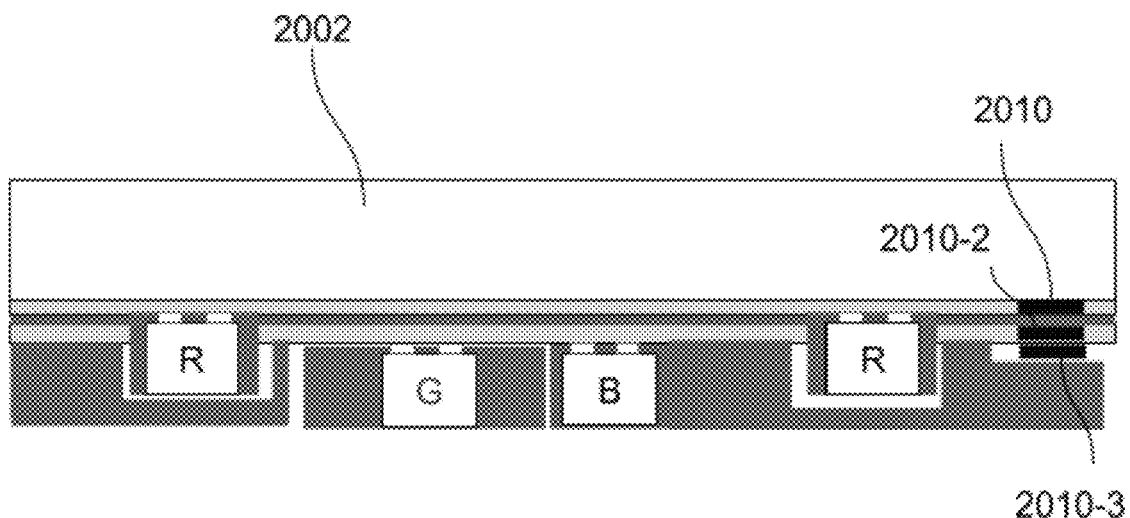
FIG. 20E shows cross section of bonding of the third layer structure to the system substrate, in accordance with an embodiment of the invention.

FIG. 20E shows cross section of bonding of the third layer structure to the system or temporary (carrier) substrate. Here, the bonded first and second tile layer structure is aligned with the third tile layer either through alignment marks (2010, 2010-2, 2010-3) or through the other structure in the tile structures. The third tile is then bonded to the second and first tile through the means of adhesive or bonding pads. The process of stacking can continue for adding more functional microdevice tiles into the substrate. Via can be formed through the tiles to connect them together.

In another embodiment, driving circuitry may form on the substrate prior to stacking of the tile layers. Here, via/opening can be used to connect the tiles to the driving circuitry. The driving circuitry can be pixel circuits. Planarization and protection layer may be formed after the driving circuitry for preparing the surface for integration of stacked tile structure. The driving circuitry can be also a tile structure transferred to the substrate.

Each tile structure can be tested prior to stacking and the one that meet some threshold in terms of performance and yield will be stacked.

Figure 21A:
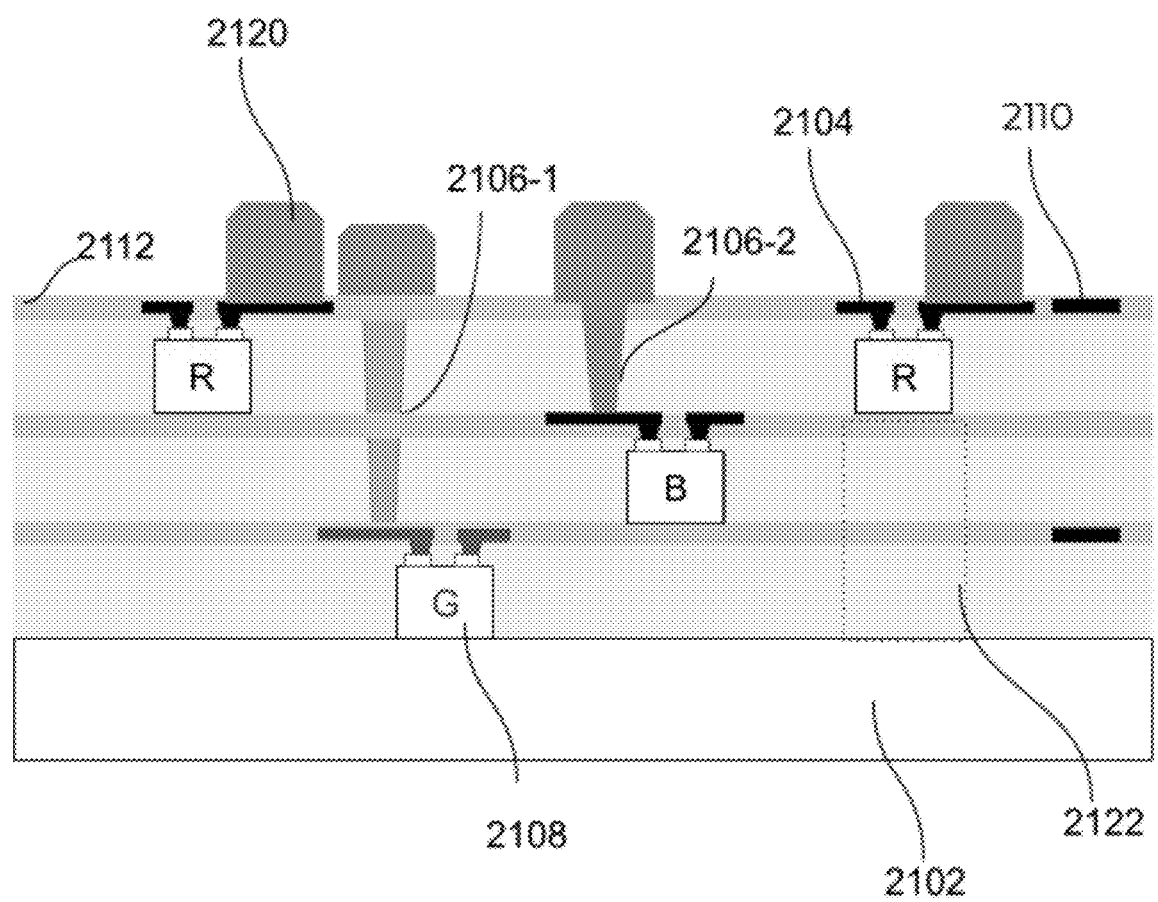
FIG. 21A-21C shows cross section of color tile with bonding pads formed on top of the stacked layers, in accordance with an embodiment of the invention.

FIG. 21A shows a cross section of color tile with bonding pads 2120 formed on top of the stacked layers. Here, the substrate 2102 may be at bottom side. The bonding layers (2106-1, 2006-2) may be formed between the tile layers 2112 for enabling integration of microdevices. The substrate 2102 may be one of a stacking substrate, a system substrate, a temporary substrate or a backplane. Here, a tile structure is a full color tile that includes a plurality of microdevices (e.g, R, G, B as shown in FIG. 19). The microdevices may be bonded to the substrate in different tile layers 2112. There can be common electrode 2104 between each tile connecting one terminal of the devices together. The common electrode can be at multiple tiles or at the final common metalization layer. Optical structure 2122 can form on top of each microdevice at different tiles to allow better light coupling to outside or from outside world to the device. In one case, the optical structure can be vias with metal around the area over the microdevice to confine the light.

A bonding layer 2106-1 may be formed on a surface where the second microdevice tile (e.g. G) will be bonded. The bonding layer can be adhesive or bonding pads. The adhesive can be different materials such as SUB, Polyamide, UV or thermal curable epoxy. The bonding pads can be Au/In or Au/Au or other materials compatible with compression, thermal compression, eutectic and bonding methods.

In one embodiment, a backplane may be formed on top, bottom or in between the tile layers.

In one embodiment, one or more planarization layers may be formed to level the substrate surface. In one case, an opening through the planarization layer(s) may be provided to create contact between the microdevices and substrate. In another case, the bonding layers and the planarization layer may be the same. In another case, the bonding layers may be formed separately.

Figure 21B:
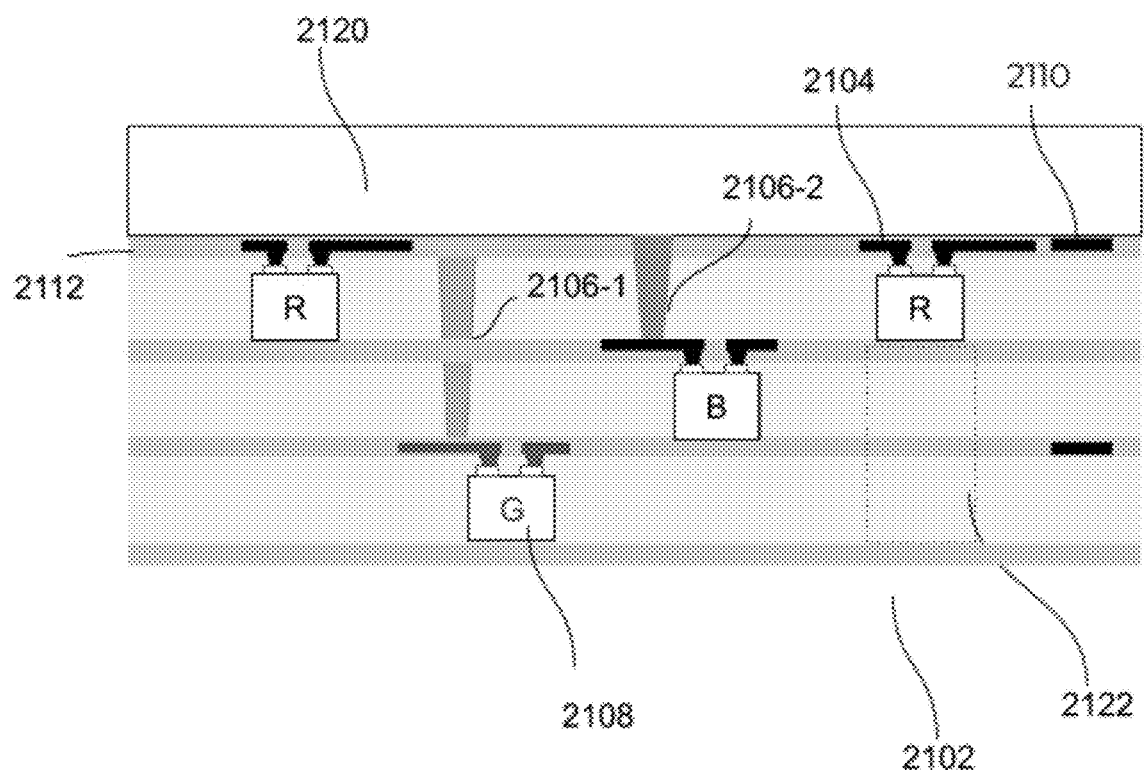

FIG. 21B shows vias can be formed through the tiles to connect them together and the backplane may be mounted to the top of the stacked layers through vias.

Figure 21C:
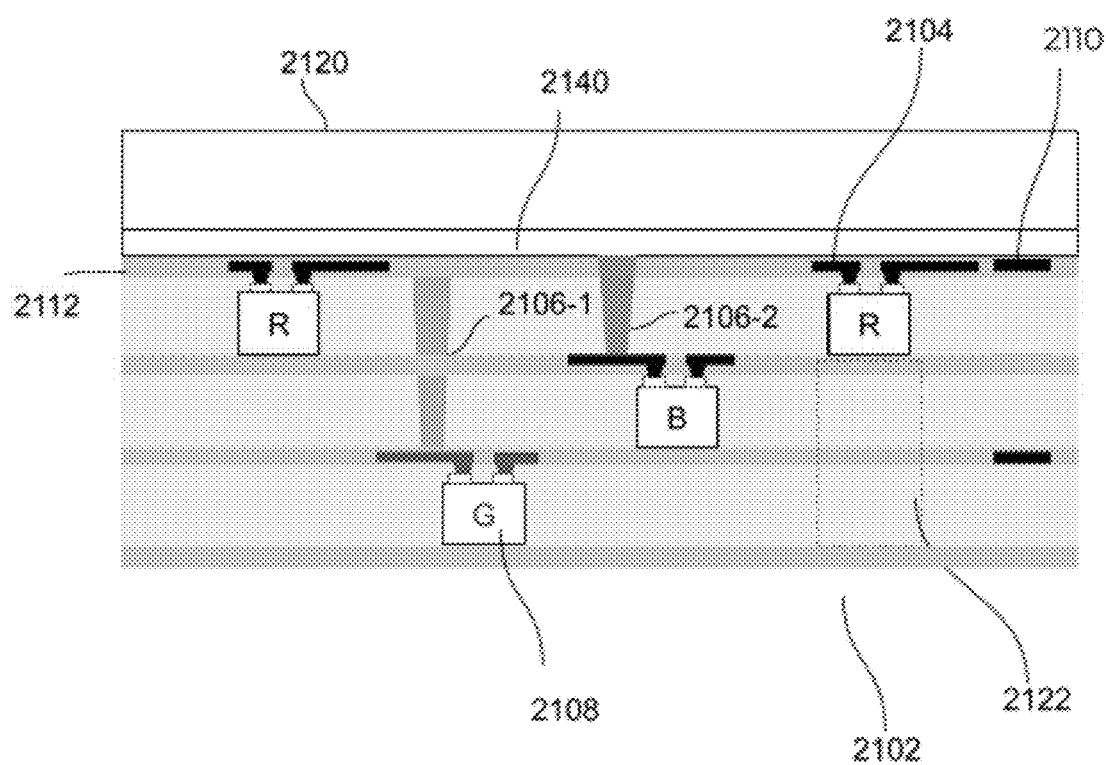

FIG. 21C shows driving circuitry 2120 may form on the substrate prior to stacking of the tile layers. Here, via opening can be used to connect the tiles to the driving circuitry. The driving circuitry can be pixel circuits. Planarization and protection layer may be formed after the driving circuitry for preparing the surface for integration of stacked tile structure. The driving circuitry can be also a tile structure transferred to the substrate.

Figure 22:
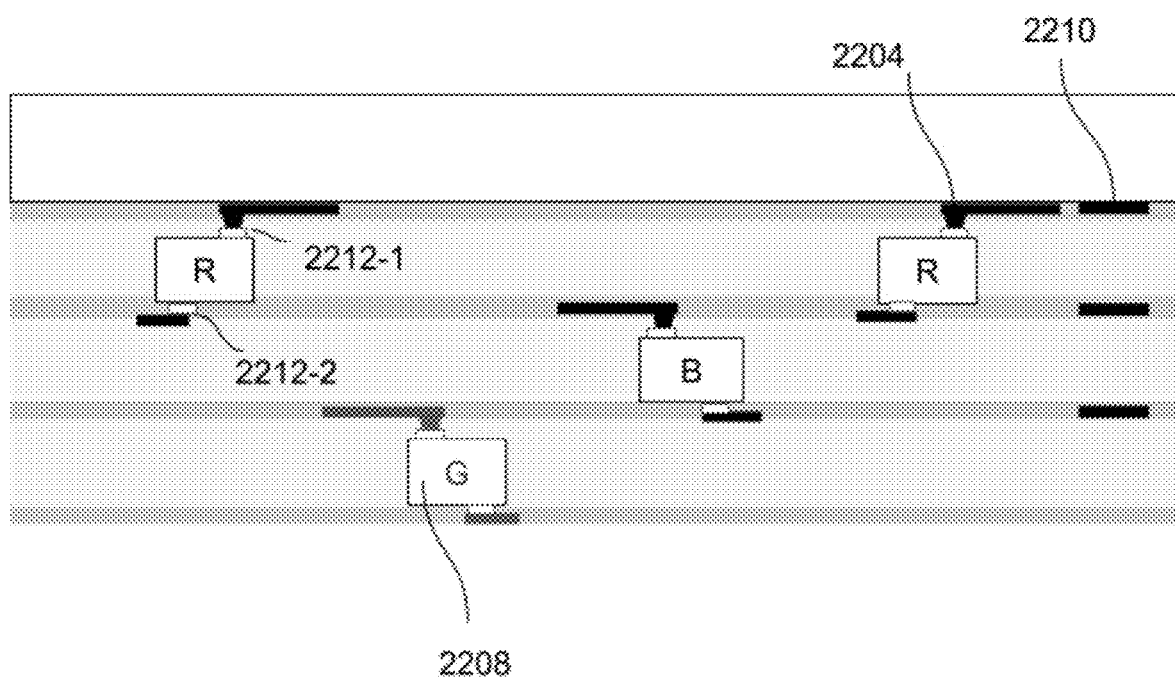
FIG. 22 shows another cross section of full color tile bonded to a system (or temporary) substrate, in accordance with an embodiment of the invention.

FIG. 22 shows another cross section of full color tile bonded to a system (or temporary) substrate. In one embodiment, the contact pads (2212-1, 2212-2) or ohmic contacts may be formed on opposite sides of the microdevice between the tile layers. Here, the microdevice have bonding pads at top and bottom surface of the device. The metallization on the contact pads may be provided through openings in the planarization layers provided between the tile layers.

Figure 23A:
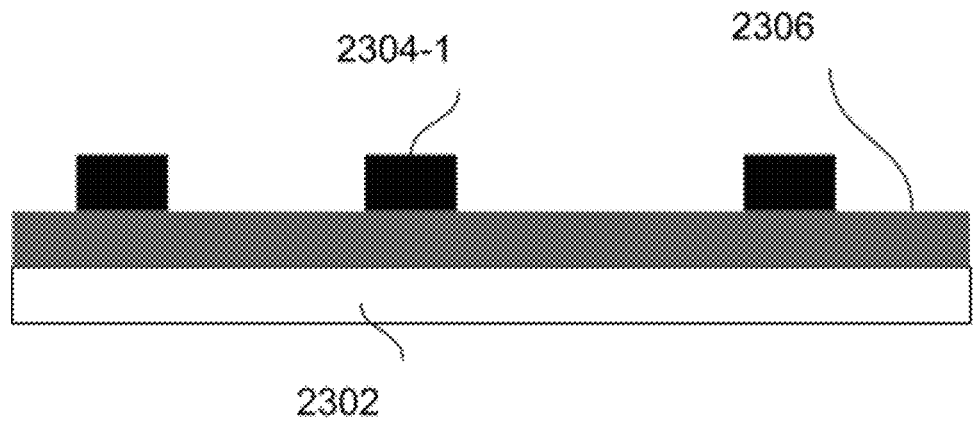
FIGS. 23A-23N show cross sectional views of process steps of stacking tiles to a backplane, in accordance with an embodiment of the invention.

FIG. 23A shows a cross-sectional view of a single-color tile structure, in accordance with an embodiment of the invention. Here, a carrier substrate 2302 is provided with one or more microdevices 2304. These microdevices 2304 can be fabricated directly on the carrier substrate or transferred to the carrier substrate from a growth substrate. The microdevices can be of the same type. In one example, the microdevices are microLED and can be the same color. The color can be one of red, green or blue. A buffer layer 2306 can be formed on the substrate 2302 before transferring the microdevices 2304-1 to the carrier substrate 2302. The buffer layer can be a release layer, a supporting substrate, or a backplane layer. It can include some optical layer as well.

Figure 23B:
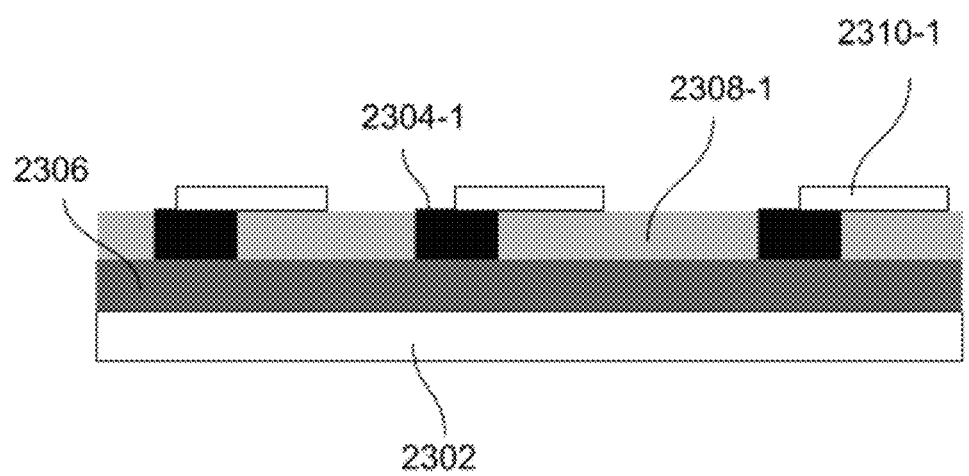

FIG. 23B shows a cross-sectional view of a single-color tile structure with planarization layer and top electrodes, in accordance with an embodiment of the invention. Here, a planarization layer 2308-1 is formed around the microdevice. Other processing steps can be performed after the formation of planarization layer 2308-1. For example, the planarization layer 2308-1 is patterned or etch backed to open a connection to the microdevices 2304-1. Each of the microdevices may be provided with an electrode 2310-1 over a top surface of microdevices 2304-1.

Figure 23C:
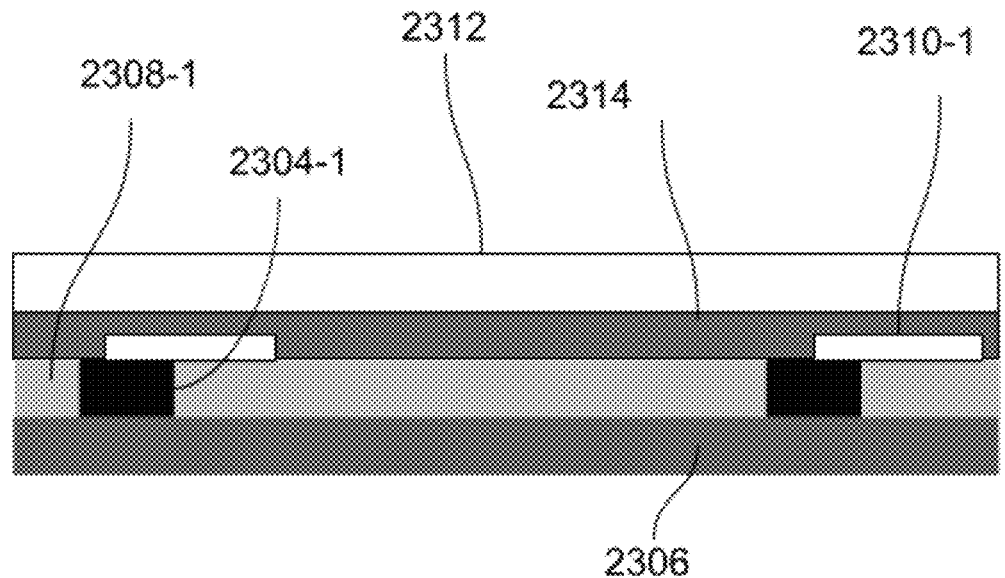

FIG. 23C shows a cross-sectional view of a first single color tile structure bonded to a system (or temporary) substrate, in accordance with an embodiment of the invention. The substrate 2312 may be one of a stacking substrate, a system substrate, a temporary substrate or a backplane. Here, a first tile layer structure (as shown in FIGS. 23A & 23B) having microdevices e.g. 2304-1 released from the carrier substrate and bonded or transferred to a substrate 2312. The substrate 2312 can be a temporary substrate. The first tile structure is bonded to the temporary substrate 2312 through an application of adhesive layer or bonding layer 2314 between microdevices 2304-1 and the temporary substrate 2312. Then, the carrier substrate can be removed after bonding with the temporary substrate. In one case, the buffer layer can also be removed.

Figure 23D:
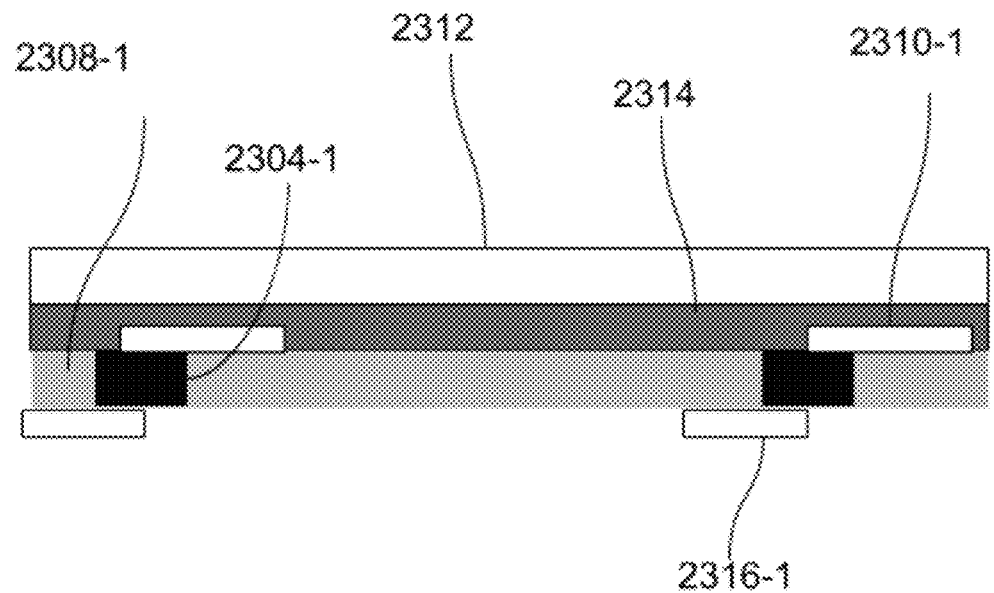

FIG. 23D shows a cross-sectional view of a first single color tile structure bonded to a system (or temporary) substrate having bottom connections, in accordance with an embodiment of the invention. The connections can be provided to the microdevices on a surface opposite to the microdevices. Here, after the removal of buffer layers, bottom electrodes 2316-1 may be formed on a surface opposite to a first surface of microdevices 2304-1 to extend the connection of the microdevices if there is one at the bottom side.

The process of stacking can continue for adding more functional microdevice tile structure layers into the temporary substrate. In one embodiment, the first microdevice tile and the second microdevice tile and subsequent tiles are physically separated from one another.

In one embodiment, the temporary substrate is bonded at the top of the tile structure. In another embodiment, the temporary substrate may be bonded at a bottom side of the tile structure.

Figure 23E:
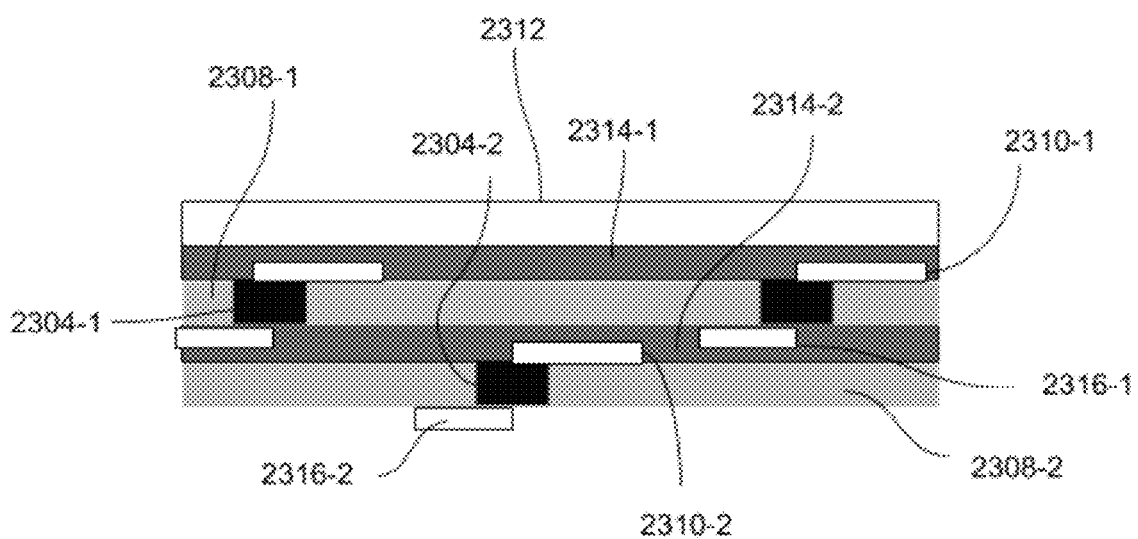

FIG. 23E shows a cross-sectional view of a second single color tile structure bonded to the temporary substrate, in accordance with an embodiment of the invention. Here, a second tile layer structure having microdevices e.g., 2304-2, a second planarization layer 2308-2, top electrodes 2310-2 and bottom electrodes 2316-2 may be formed separately on another carrier substrate. The microdevices 2304-2 can be released from other carrier substrate and aligned with the first tile layer structure. The second tile structure layer is then bonded to the first tile structure layer through the means of adhesive layer or bonding pads 2314-2. Each of the second microdevices 2304-2 can be provided with top electrodes 2310-2 over a top surface of the microdevices and bottom electrode 2316-2 on a surface opposite to a first surface of microdevices 2304-2 to extend the connection of the microdevices 2304-2 if there is one at the bottom side.

Figure 23F:
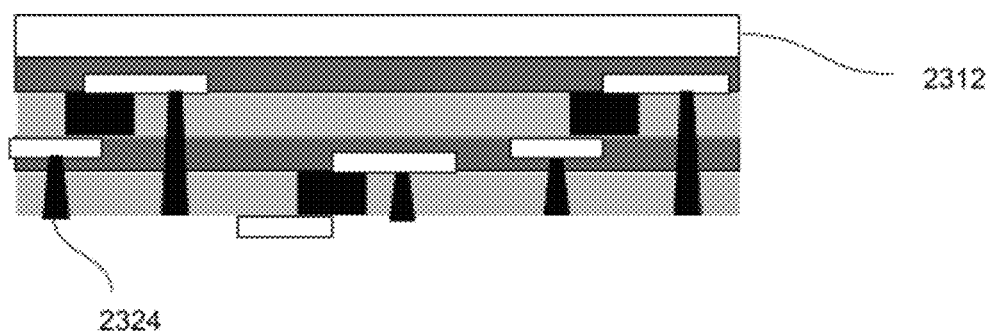

FIG. 23F shows a cross-sectional view of vias formed through the tile structures, in accordance with an embodiment of the invention. Here, vias 2324 can be formed through the tile structure layers to connect them together or provide connection to connect different layers to the temporary substrate 2312.

Figure 23G:
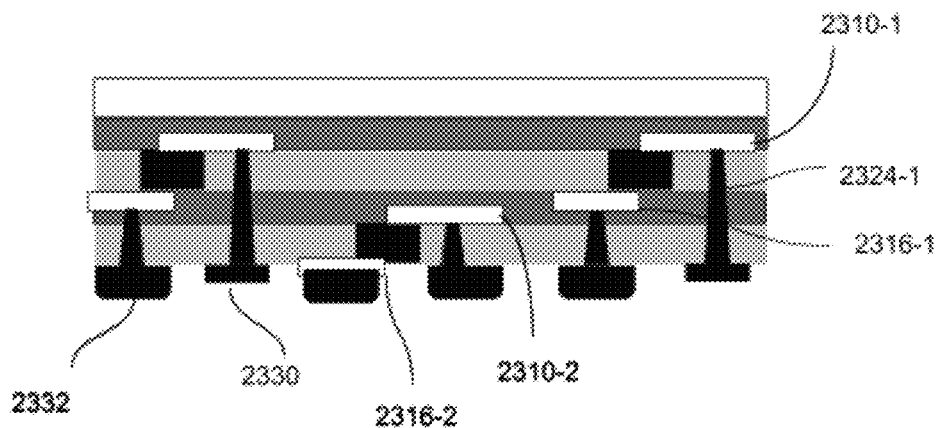

FIG. 23G shows a cross-sectional view of vias connected with pads and electrodes, in accordance with an embodiment of the invention. Here, vias 2324 corresponding to top electrodes (2310-1, 2310-2) can be filed with conductive materials and some can be connected together to form a common electrode 2330. The common electrode between each tile connecting one terminal of the devices together. The common electrode can be at multiple tiles or at the final common metalization layer. Pads 2332 can be formed on part of the bottom electrodes (2316-1, 2316-2) for bonding or some can be connected together to form a common pad.

Figure 23H:
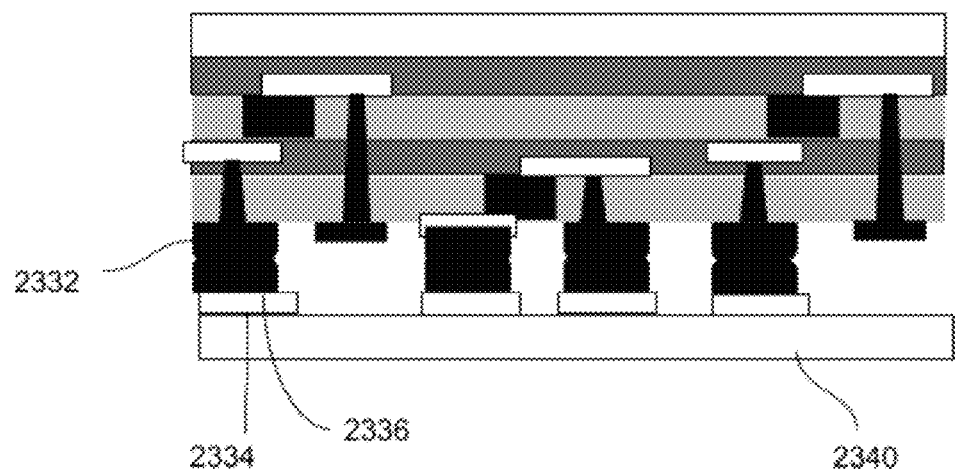

FIG. 23H shows a cross-sectional view of bonding between the temporary substrate and a backplane, in accordance with an embodiment of the invention. In one embodiment, the backplane and temporary substrate may be prepared separately from the tiles and then can be bonded together. In another embodiment, the backplane is flexible between the tiles structures. The backplane 2340 may include driving circuitry 2334. The driving circuitry may include pixels circuits and electrodes. The driving circuitry can include a common electrode or a patterned electrode for each microdevice. The backplane 2340 can have pads corresponding to the pads 2332 of stacked microdevices. The microdevices can get bonded or connected to the backplane 2340 through the pads 2336 or other adhesive layers.

Figure 23I:
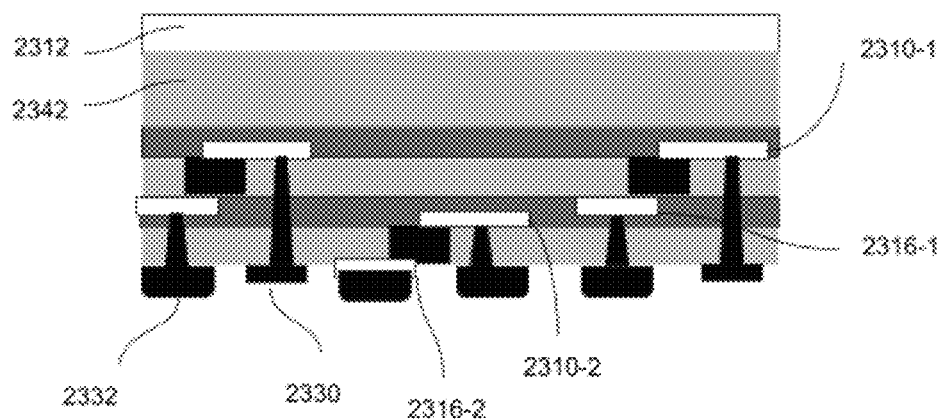

FIG. 23I shows a cross-sectional view of an optical layer on the temporary substrate, in accordance with an embodiment of the invention. Here, an optical layer 2342 can be provided on the temporary substrate 2312 prior to stacking tile layer structures. The optical layer 2342 can confine the light output of the microdevices or the input light to the microdevices. Furthermore, the optical layer 2342 can also reduce the viewing angle effect as the light of different layers will be combined and push out through the optical layer 2342.

Figure 23J:
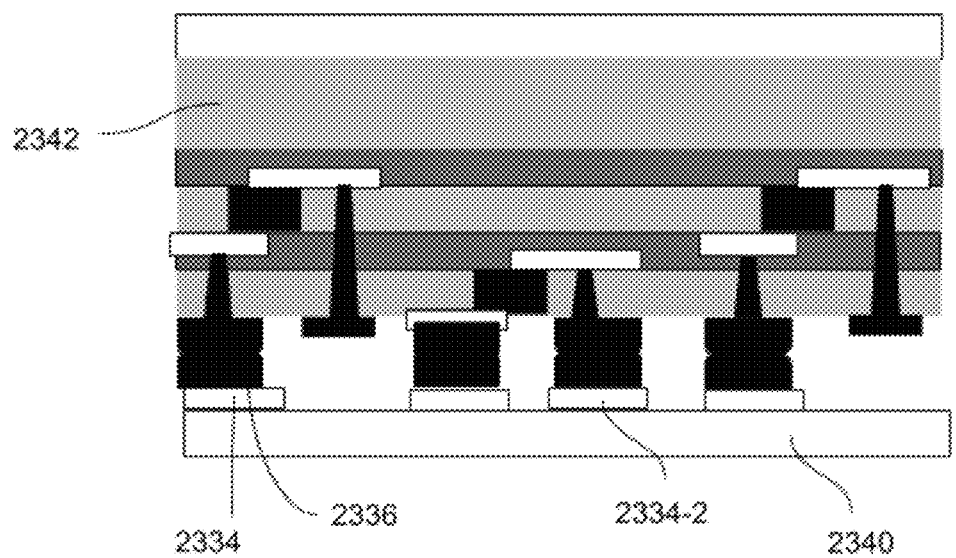

FIG. 23J shows a cross-sectional view of an optical layer on the temporary substrate bonded to the backplane, in accordance with an embodiment of the invention. Here, an optical layer 2342 can be provided on the temporary substrate 2312 prior to stacking microdevice layers. In one case, optical layer can form on top of each microdevice at different tiles to allow better light coupling. The optical layer can confine the light output of the microdevices or the input light to the microdevices. It can also reduce the viewing angle effect as the light of different layers will be combined and push out through the optical layer 2342. Then, the temporary substrate and the backplane can be bonded together. The backplane 2340 may include driving circuitry 2334. The driving circuitry may include pixels circuits and electrodes. The driving circuitry can include a common electrode or a patterned electrode for each microdevice. The backplane 2340 can have pads corresponding to the pads 2332 of stacked microdevices. The microdevices can get bonded or connected to the backplane 2340 through the pads 2336 or other adhesive layers.

Figure 23K:
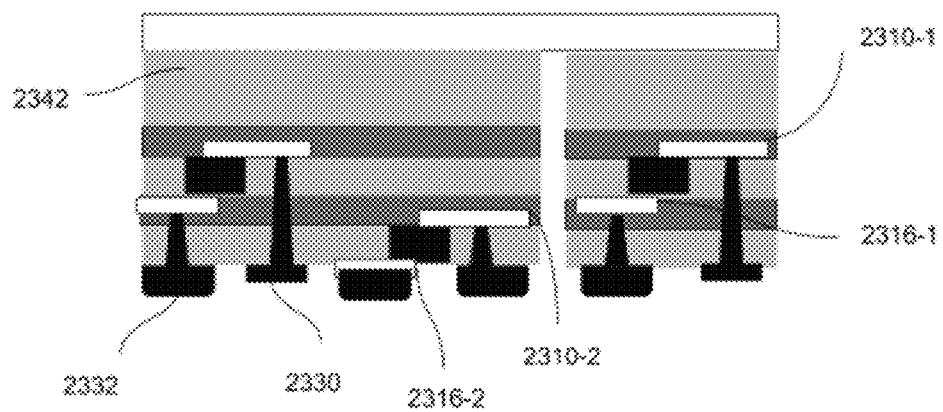

FIG. 23K shows a cross-sectional view of patterned stacked tiles layer structure on a temporary substrate, in accordance with an embodiment of the invention. Here, the stacked tiles layer structure can be patterned to create isolated areas including a plurality of microdevices. The isolated areas or islands can represent pixel areas. The patterning can happen at the temporary substrate or after bonding to the backplane.

Figure 23L:
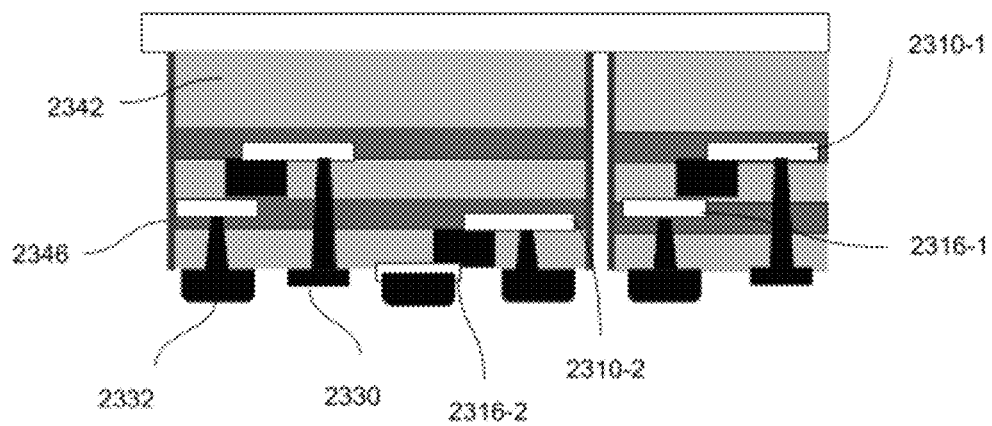

FIG. 23L shows a cross-sectional view a reflective layer formed around the islands, in accordance with an embodiment of the invention. Here, a reflective layer 2346 can be formed around the islands to further reduce the viewing angle effect by directing the light from different layers to one surface.

Figure 23M:
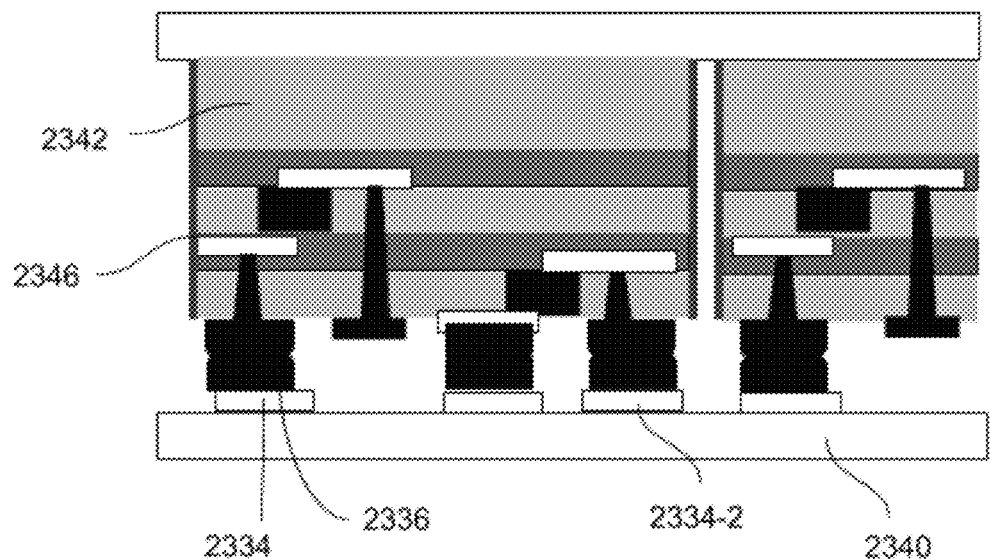

FIG. 23M shows a cross-sectional view of patterned stacked tiles layer structure on a backplane, in accordance with an embodiment of the invention. Here, the stacked tiles layer structure can be patterned to create isolated area including a plurality of microdevices after bonding to the backplane. The isolated areas or islands can represent pixel areas. The patterning happened after bonding the temporary substrate to the backplane.

Figure 23N:
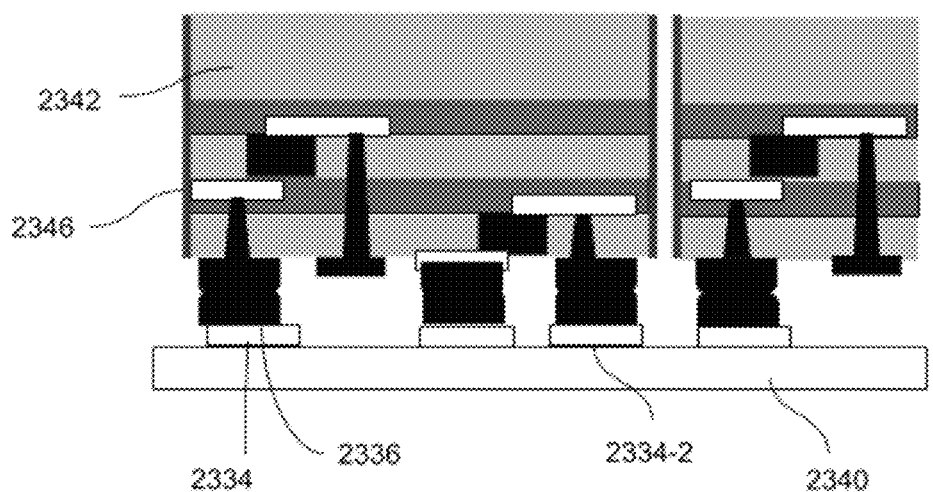

FIG. 23N shows a cross-sectional view of removal of the temporary substrate, in accordance with an embodiment of the invention. Here, after bonding with the backplane, the temporary substrate can be removed. The space between pixels can be filed by fillers. The fillers can be black matrix. In one case, the fillers can be filled between the pixels prior to transfer to the temporary substrate.

Figure 24:
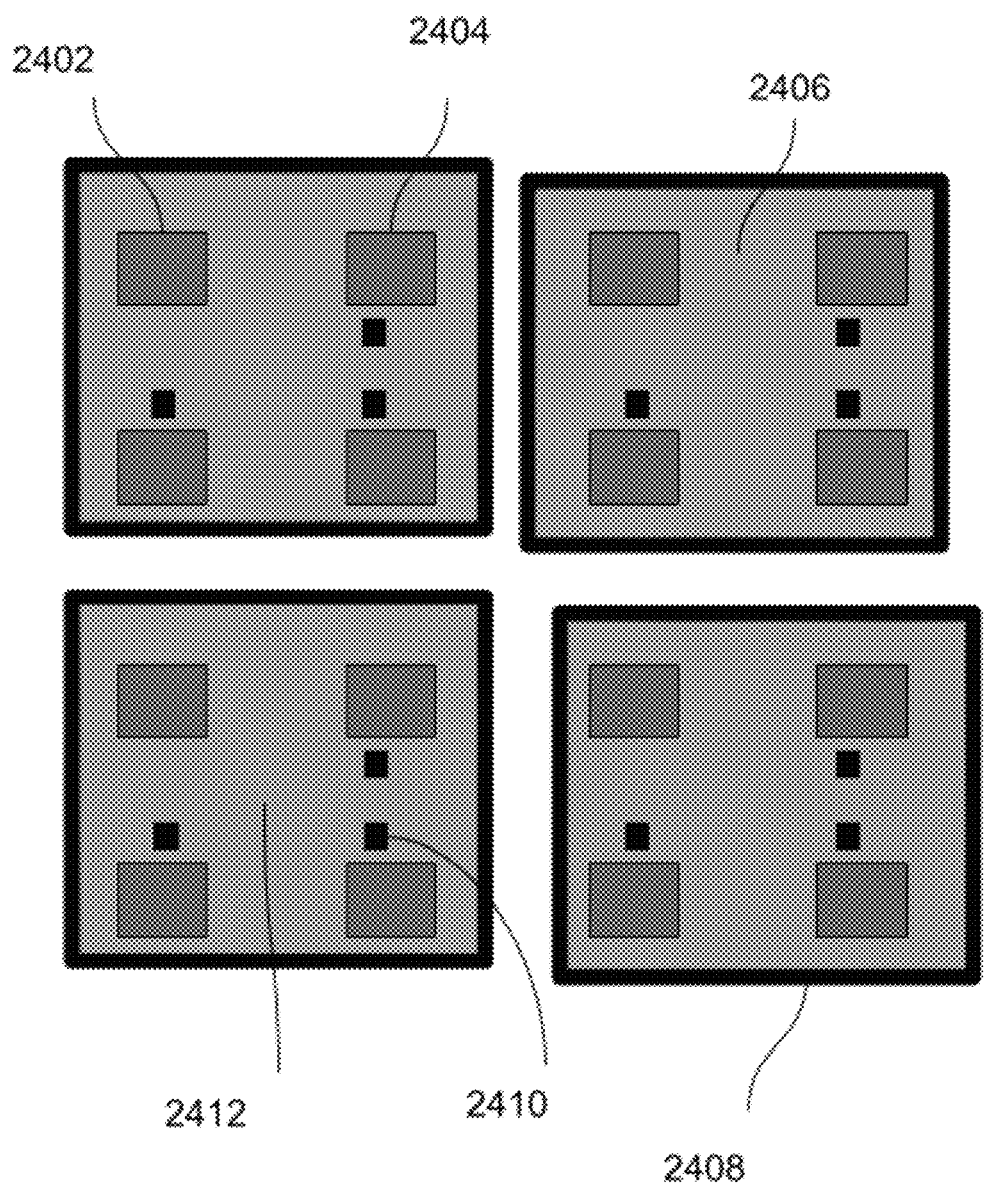
FIG. 24 shows a top view of a tiled stacked display as shown in FIG. 23N, in accordance with an embodiment of the invention.

FIG. 24 shows a schematic top view of a tiled stacked display as shown in FIG. 23N, in accordance with an embodiment of the invention. Here, in top view of a tile stacked display, the stacked layer structure is patterned into isolates area of islands including plurality of microdevices. The islands can be formed with some random positioning to reduce the visual artifact in case few different tiles are bonded in one backplane. Each island may include common pads 2402, common electrode 2412, vias 2410, microdevice pads 2404, planarization layers 2306 and reflector layers 2408 around the islands to further reduce the viewing angle effect by directing the light from different layers to one surface.

According to one embodiment, a method of integrating microdevices may be provided. The method may comprising: providing one or more microdevices on a donor substrate, integrating a first set of microdevices from the donor substrate to a system substrate, providing one or more staging pads to a second set of devices on the donor substrate; and integrating the second set of microdevices to the system substrate.

According to another embodiment, the one or more staging pads are one of: a conductive layer, a planarization layer, or a pillar formed on a substrate or microdevice surface and the one or more staging pads create a connection between the microdevices and the system substrate.

According to one embodiment, the method may further comprising providing one or more planarization layers over integrated microdevices to the system substrate, wherein an opening is created in the planarization layer to couple the microdevices to a signal.

According to another embodiment, the method may further comprising depositing an electrode over the microdevices through the opening in the planarization layer, adding a bonding layer to the electrode and a reflective layer is provided to each microdevice.

According to some embodiments, the first microdevice and the second microdevice are overlapped and connected through a common electrode.

According to one embodiment, a solid state array device comprising one or more pixels, each pixel has two or more microdevices and at least one of the two microdevices coupled to a pixel circuit and each microdevice is coupled to a bias voltage through a corresponding switch.

According to another embodiment, the pixel circuit is one of: a pixel circuit corresponding to each microdevice and a shared pixel circuit between the microdevices and wherein the shared pixel circuit is allocated to each microdevice for a given time during a frame time.

According to some embodiments, the one of the microdevices is coupled to the shared pixel circuit through the switch and decoupled to the bias voltage, to turn on the microdevice during an operational mode and the one of the microdevices is decoupled from the shared pixel circuit through the switch and coupled to the bias voltage, to turn off the microdevice during an unoperational mode.

According to one embodiment, an on time of each microdevice is extended and at least two microdevices are operational during one sub frame of the frame time. Each microdevice is provided with a corresponding storage element coupled to the shared pixel circuit through corresponding switches, wherein the storage element comprises a capacitor.

According to another embodiment, a method of stacking tile structure layers to a substrate may be provided. Each tile structure layer comprising plurality of microdevices. The method may comprising: releasing a first tile structure layer on the substrate, providing and aligning a second tile structure layer with the first tile structure layer on the substrate; and bonding the first tile structure layer and the second tile structure layer on the substrate, wherein the first tile structure and the second tile structure are physically separated from each other.

According to a further embodiment, the second tile structure layer aligned with the first tile structure layer through alignment marks, the second tile structure layer bonded to the first tile structure layer through means of an adhesive layer or bonding pads, wherein the bonding pads formed on either side of the microdevices between tile structures layers and the first tile structure layer and second tile structure layer is covered with planarization layers and metalization layers.

According to another embodiment, the method may further comprising providing vias through the planarization layers to connect first tile structure layer and second tile structure layer together or provide connection to connect different tile structure layers to the substrate, providing vias through first tile structure layer and second tile structure layer to couple the tile layers to controlling and biasing signals, wherein the substrate is one of: a temporary substrate, a system substrate or a backplane and is affixed to either a bottom surface, a top surface or in between the tile layer structures. The microdevices are of the same or different colors.

According to one embodiment, the method may further comprising providing driving circuitry on the substrate prior to stacking the tile layer structures, testing each tile structure layer prior to stacking, providing bonding layers between the tile structures layers for enabling integration of microdevices, providing common electrode between each tile structure layer for connecting one terminal of the microdevices together and forming an optical structure on each microdevice at different tile structure layers.

According to another embodiment, the bonding layers is one of adhesive or bonding pads, wherein the adhesive is one of: SU8, Polyamide, UV or thermal curable epoxy, The bonding pads is one of: Au/In, Au/Au or other materials compatible with compression, thermal compression, and eutectic bonding methods and formed on either side of the microdevice between the tile structures layers. The second tile structure layer has dents in the planarization layer to receive microdevices from the first tile layer structure, wherein an excess of planarization layer around the microdevices in the first layer structure is removed to ease the bonding.

According to one embodiment, a display device may be provided. The display device may comprising a plurality of tile structures stacked with each other, each of the tile structure including: a substrate; an array of microdevices disposed on the substrate; top electrodes disposed on a first surface of each microdevice; and bottom electrodes disposed on a surface opposite to the first surface of the microdevices; and a backplane bonded to the plurality of the tile structures.

According to one embodiment, the plurality of tile structures transferred to a temporary substrate before bonding with the backplane and the plurality of tile structures are bonded with each other through a bonding layer in between.

According to another embodiment, a planarization layer is formed between the array of microdevices for each tile structure and provides openings for the top electrodes and the bottom electrodes to make connections with microdevices. A common electrode is provided between each tile structures for connecting the microdevices together.

According to some embodiments, the bottom electrodes comprises bonding pads for the microdevices to bond with the backplane. The backplane comprises driving circuitry and contact pads corresponding to the bonding pads of the microdevices. An optical layer is provided on the temporary substrate prior to stacking tile structures to the temporary substrate, wherein the stacked tiles structures are patterned to create islands at the temporary substrate or after bonding to the backplane.

According to another embodiment, a reflective layer is provided around the islands to reduce viewing angle effect by directing the light from different tile structures to one surface.

According to a further embodiment, the temporary substrate is removed after bonding with the backplane and a space between the microdevices is filled by a filling material before or after bonding with the backplane.

In summary, the present disclosure discloses structures and methods to integrate microdevices into system or receiver substrates. The integration of microdevices is facilitated by adding staging pads to microdevices before or after transferring. Creating stages after the transfer of a first microdevice to a substrate for the subsequent microdevice transfer to the first (or the second) microdevice transfer. The stage improves the surface profile of the substrate so that next microdevice can be transferred without the first microdevice on the substrate get damaged by or interfere with the surface of the donor or transfer head. Some embodiments further relate to tiled display device and more particularly, to stacking tiles to a backplane to form the tiled display device.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

We claim:

1. A solid state array device comprising one or more pixels;
   each pixel having at least two microdevices connected directly to a shared pixel circuit and each microdevice coupled to a bias voltage through a corresponding switch for bias voltage and the pixel having at least two storage elements;
   each microdevice provided via the shared pixel circuit with a corresponding storage element;
   each storage element connected to a switch configuration connecting with a common pixel element or to another common bias voltage through another switch; and
   another switch configuration to connect storage elements with a corresponding individual bias voltage.

2. The solid state array device of claim 1, wherein the shared pixel circuit is allocated to each microdevice for a given time during a frame time.

3. The solid state array device of claim 1, wherein one of the microdevices coupled to the shared pixel circuit is decoupled to the bias voltage, to turn on the microdevice during an operational mode.

4. The solid state array device of claim 1, wherein one of the microdevices is decoupled from the shared pixel circuit and coupled to the bias voltage, to turn off the microdevice during an unoperational mode.

5. The solid state array device of claim 1, wherein an "ON time" of each microdevice for a frame is extended such that the at least two microdevices are operational during one sub frame of a frame time.

6. The solid state array device of claim 1, wherein the storage element comprises a capacitor.

7. The solid state array device of claim 1, wherein the storage elements are connected to the corresponding bias voltage through another switch.

* * * * *